United States Patent
Yamashita et al.

(10) Patent No.: US 8,403,532 B2
(45) Date of Patent: Mar. 26, 2013

(54) LED MODULE AND LED LIGHT SOURCE APPARATUS

(75) Inventors: Atsushi Yamashita, Osaka (JP);
Hiroyuki Nabesawa, Osaka (JP);
Hiroshi Nishioka, Osaka (JP);
Masahiko Watanabe, Osaka (JP); Ken Sumitani, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 493 days.

(21) Appl. No.: 12/659,106

(22) Filed: Feb. 25, 2010

(65) Prior Publication Data

US 2010/0220479 A1   Sep. 2, 2010

(30) Foreign Application Priority Data

Feb. 27, 2009   (JP) ................... 2009-045120

(51) Int. Cl.
*F21V 21/00* (2006.01)

(52) U.S. Cl. .................................. 362/249.02

(58) Field of Classification Search .................. 362/240, 362/249.01–249.02
See application file for complete search history.

(56) References Cited

U.S. PATENT DOCUMENTS

| | | | |
|---|---|---|---|
| 2004/0095777 A1* | 5/2004 | Trenchard et al. | 362/477 |
| 2010/0103649 A1 | 4/2010 | Hamada | |

FOREIGN PATENT DOCUMENTS

| | | |
|---|---|---|
| JP | 62-034468 | 9/1987 |
| JP | 2003-207780 | 7/2003 |
| JP | 2007-026858 | 2/2007 |
| JP | 2007-201334 | 8/2007 |
| JP | 2007-305512 | 11/2007 |
| JP | 2008-053062 | 3/2008 |
| WO | WO 2008/090643 | 7/2008 |

* cited by examiner

*Primary Examiner* — Anh Mai
*Assistant Examiner* — Hana Featherly
(74) *Attorney, Agent, or Firm* — Harness, Dickey & Pierce, P.L.C.

(57) ABSTRACT

An LED module comprises: an insulating substrate in plate form; first main and sub terminals for connection to an external circuit formed near the first side of the insulating substrate; second main and sub terminals for connection to an external circuit formed near the second side opposite to the first side; three or more connecting wires formed on the insulating substrate for connecting LEDs continuously aligned at a distance from each other in series; LEDs individually connected between the connecting wires adjacent to each other and connected in series in a same direction; and a first passing wire formed on the insulating substrate for electrically connecting the first sub-terminal to the second sub-terminal, wherein a first connecting wire located on one side is electrically connected to the first main terminal, and a second connecting wire located on the other side is electrically connected to the second main terminal.

10 Claims, 30 Drawing Sheets

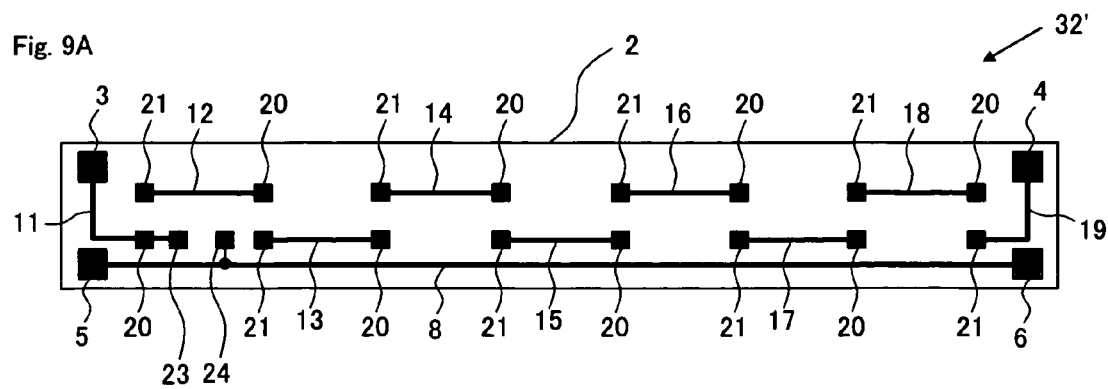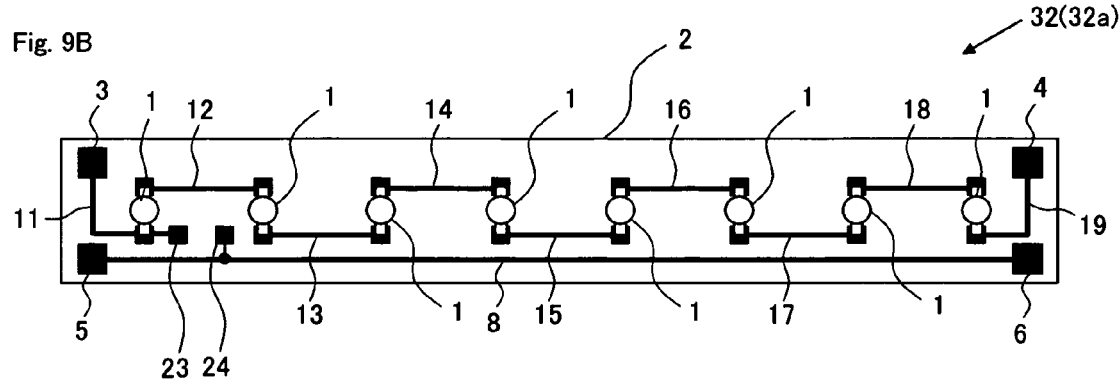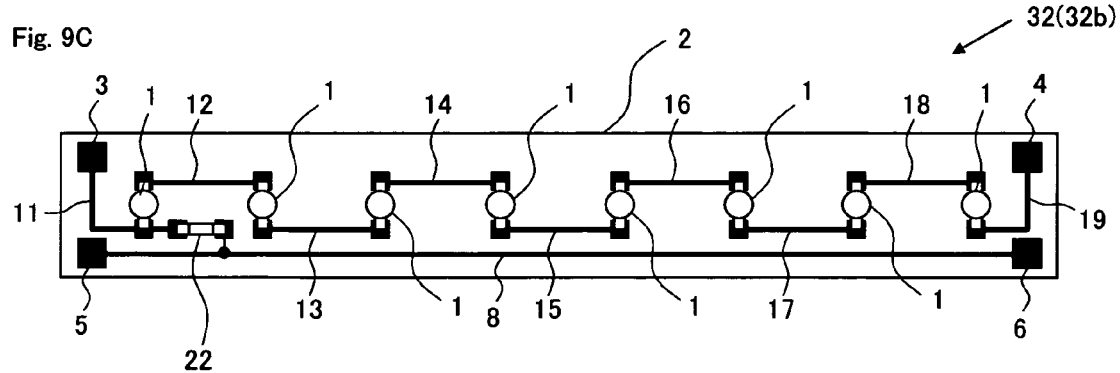

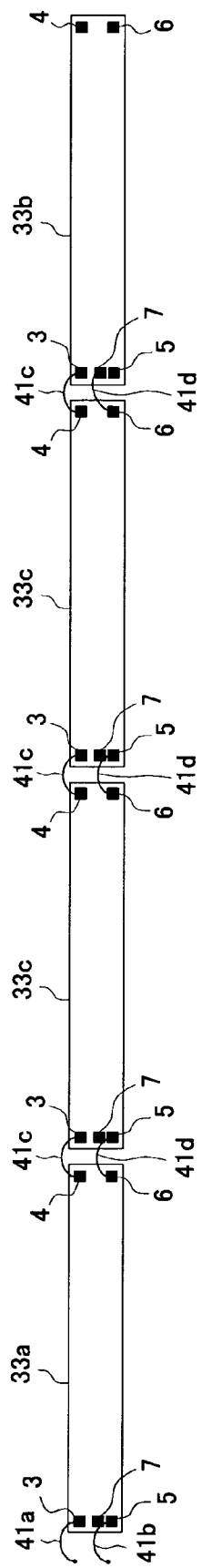

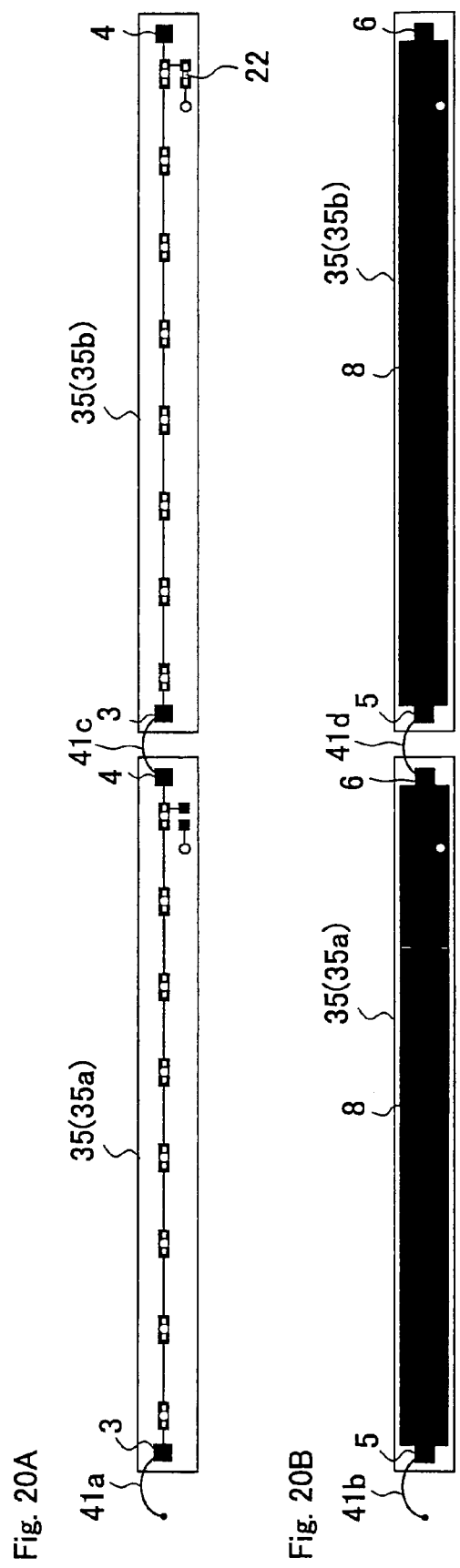

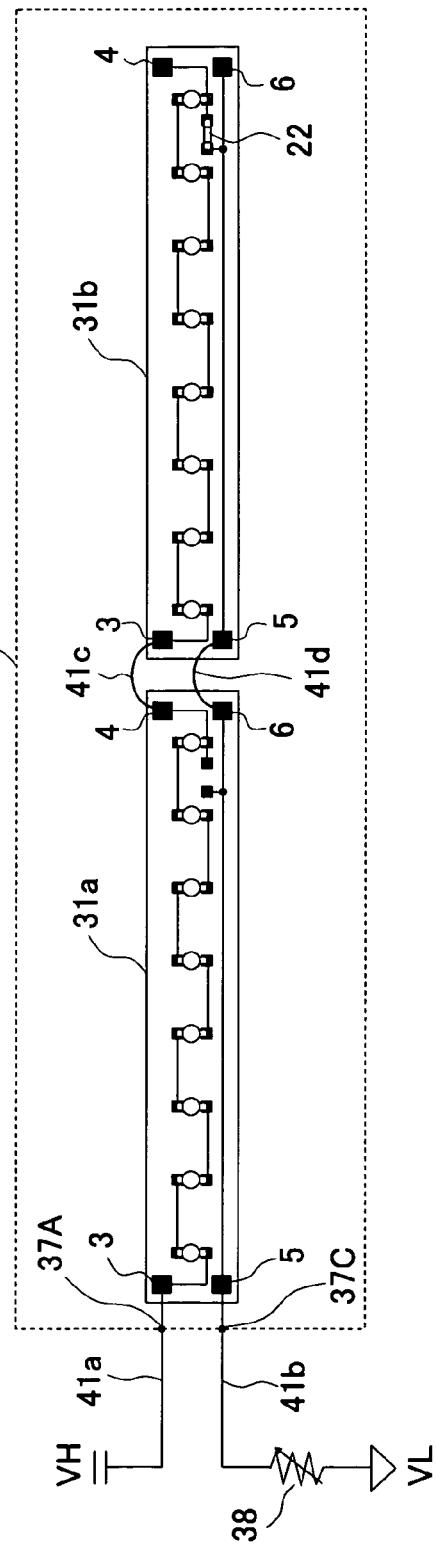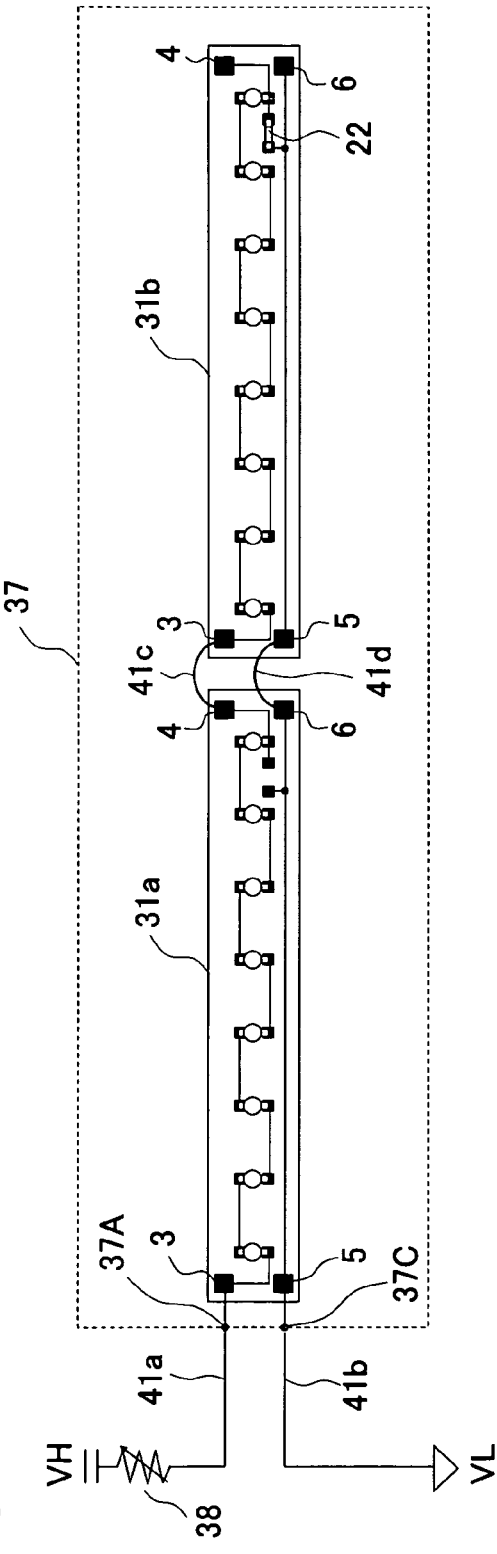

LED MODULE AND LED LIGHT SOURCE APPARATUS

CROSS REFERENCE TO RELATED APPLICATION

This Nonprovisional application claims priority under 35 U.S.C. §119(a) on Patent Application No. 2009-045120 filed in Japan on 27 Feb. 2009 the entire contents of which are hereby incorporated by reference.

BACKGROUND OF THE INVENTION

1. Field of the Invention

The present invention relates to an LED module in which LEDs (light emitting diodes) are mounted, as well as an LED light source apparatus.

2. Description of the Related Art

Transmission type liquid crystal displays are provided with a backlight apparatus on the rear of the liquid crystal panel as a light source. Though conventional light sources for light source apparatuses used as a backlight are mainly CCFLs (cold cathode fluorescent lamps), LEDs have been expected to be used more and more as a light source instead of CCFLs as the technology develops. Japanese Unexamined Patent Publication 2003-207780, for example, (hereinafter referred to as Document 1) describes a backlight apparatus where LEDs are used as light emitting elements. In Document 1, as many LEDs as necessary are mounted on a substrate with uniform distribution, so that a light source apparatus that can illuminate the entire screen is provided. In addition, such surface illumination is also possible by aligning a number of LED modules, which are linear light sources where a number of LEDs are aligned in a line, on a substrate, as described in Japanese Unexamined Patent Publication 2008-53062, for example. In addition, in the case where a number of LEDs are aligned on a substrate, there are methods according to which LEDs are aligned in parallel, as in Document 1, or a predetermined number of LEDs are aligned in series, as in Japanese Examined Utility Model Publication S62 (1987)-34468.

Accordingly, in LED modules where a number of LEDs that are aligned in a line are connected in series on a substrate, an anode terminal 3 and a cathode terminal 4 for leading out the anode and cathode at the two ends of the number of LEDs 1 that are connected in series are provided on a substrate 2, as shown in FIGS. 25 and 26. A first case, where the anode terminal 3 and the cathode terminal 4 are provided at one end of the substrate 2, as shown in FIG. 25, and a second case, where the anode terminal 3 is provided at one end of the substrate 2 and the cathode terminal 4 is provided at the other opposite end of the substrate 2, as shown in FIG. 26 are possible. In the cases shown in FIGS. 25 and 26, examples of LED modules 50 and 51 where eight LEDs are connected in series are shown. Here, FIGS. 25A and 26A show the state before the LEDs are mounted, and FIGS. 25B and 26B show the state when the LEDs are mounted.

In the LED modules 50 and 51, nine connecting wires 11 to 19 for connecting eight LEDs 1 in series are formed on the insulating substrate 2, and the connecting wires 11 to 19 are provided so as to be separated each other and have terminals that are provided adjacently and sequentially. One end of the first connecting wire 11 is connected to the anode terminal 3, and the other end is provided with an electrode 20 formed for connection with the anode of one LED. One end of the second to eighth connecting wires 12 to 18 is provided with an electrode 21 for connection with the cathode of the LEDs respectively, and the other end is provided with an electrode 20 formed for connection to the anode of the LEDs respectively. One end of the ninth connecting wire 19 is connected to the cathode terminal 4, and the other end is provided with an electrode 21 formed for connection to the cathode of one LED. Electrodes 20 and 21 that are provided at the terminal of adjacent connecting wires are connected to the anodes and the cathodes of LEDs, so that eight LEDs 1 are connected in series in the forward direction between the anode terminal 3 and the cathode terminal 4, thus providing an LED module.

FIG. 27 is a configuration diagram showing external wires in the case where an LED light source apparatus where LEDs are aligned in a plane is formed by aligning LED modules 50 having an anode terminal 3 and a cathode terminal 4 at one end of a substrate, as shown in FIG. 25, in a 2×4 matrix. In the case where the LED modules 50 are formed so as to be parallel, as shown in FIG. 27, for example, a control substrate 42 for driving the LEDs in the LED modules 50 so that the light emission thereof can be controlled is provided outside, and sixteen external wires 52 become necessary to connect the anode terminals 3 and the cathode terminals 4 of the LED modules 50 to the control substrate 42, and in addition, the external wires running from the LED modules 50 provided at a distance from the control substrate 42 are long. Here, external wires are wires outside the LED modules, and referred to as external wires so as to be distinguishable from connecting wires, which are formed on the substrate within the LED modules.

In addition, FIG. 28 is a configuration diagram showing wires in the case where an LED light source apparatus where LEDs are aligned in a plane is formed by aligning the LED modules 51 in FIG. 26 in a 2×4 matrix. As compared to the LED module 50 in FIG. 25, the anode terminals 3 and the cathode terminals 4 are provided separately on facing sides, and therefore, though there are sixteen external wires 52 for connecting the anode terminals 3 and the cathode terminals 4 in the LED modules 50 to the control substrates 42, which is the same as for the LED modules 50, the external wires are longer.

Here, in the case where LEDs mounted in two LED modules 50 or 51 are connected in series, as shown in FIGS. 29 and 30, the number of external wires 52 for connecting the anode terminals 3 and the cathode terminals 4 of the LED modules 50 to the control substrate 42 can be reduced by half, but some of the external wires are still long.

As described above, in the case where a light source apparatus, such as a backlight, is formed by aligning a number of LEDs in a plane using a number of LED modules, wires for connecting the LED modules to a control substrate become necessary, irrespectively of the place where anode terminals and cathode terminals are provided. The smaller the LED modules are relative to the area illuminated by the light source apparatus, and the greater the number of LED modules used is, the longer the wires become, and the more problems there are with mounting the modules. Therefore, the greater the area to be illuminated is, the more LEDs can be mounted in the LED modules used. However, a problem arises, such that various types of LED modules must be prepared in accordance with the area to be illuminated by the light source apparatus.

SUMMARY OF THE INVENTION

The present invention is provided in view of the problem with wires being long in the case where a light source apparatus is formed using a number of LED modules, and an object of the invention is to provide LED modules for forming a light source apparatus with simple wiring.

In order to achieve the above described object, the present invention provides an LED module comprising: an insulating substrate in plate form, a first main terminal and a first sub-terminal for connection to an external circuit formed in the vicinity of a first side of the insulating substrate; a second main terminal and a second sub-terminal for connection to an external circuit formed in the vicinity of a second side of the insulating substrate, the second side being opposite to the first side of the insulating substrate; three or more connecting wires formed on the insulating substrate for connecting LEDs in series, the LEDs being aligned side by side; a plurality of LEDs individually connected between the connecting wires that are adjacent to each other and connected in series in the same direction; and a first passing wire formed on the insulating substrate for electrically connecting the first sub-terminal to the second sub-terminal, characterized in that the first connecting wire, which is one of the three or more connecting wires aligned side by side and is located on one side, is electrically connected to the first main terminal, and the second connecting wire, which is another of the three or more connecting wires aligned side by side and is located on the other side, is electrically connected to the second main terminal.

In the above characterized LED module, the first passing wire can be used as part of the external wires, and therefore, the external wires required to align a number of LED modules can be made much shorter. In particular, in the case where a number of LED modules are aligned in a line in such a direction as to be at a distance of the control substrate, and all the LEDs mounted in these LED modules are connected in series, the first main terminal, which is located in the vicinity of the first side, and the second main terminal, which is located in the vicinity of the second side, are electrically connected, the first sub-terminal, which is located in the vicinity of the first side, and the second sub-terminal, which is located in the vicinity of the second side, are electrically connected between two adjacent LED modules, and the first or second main terminal and the first or second sub-terminal located in the vicinity of the farther one of the first and second sides of the LED module located farthest away from the control substrate are electrically connected, so that the LED module columns where all of LEDs are connected in series can be formed without long external wires, and thus the external wires can be greatly simplified in light source apparatuses having a number of LED module columns.

Furthermore, in the above characterized LED module, a pair of electrodes for connection to the terminals of a two-terminal element for shortcircuit are preferably formed on the insulating substrate, and one of the pair of electrodes for connection is electrically connected to the first connecting wire or the second connecting wire, and the other of the pair of electrodes for connection is electrically connected to the first passing wire.

As described above, in the case where a number of LED modules are aligned in a line in such a direction as to be at a distance from the control substrate, and all of the LEDs mounted in these LED modules are connected in series, the first or second main terminal and the first or second sub-terminal located in the vicinity of the farther one of the first and second sides of the LED module located farthest from the control substrate can be electrically connected by connecting the two terminal elements for shortcircuit between the pair of electrodes for connection when a pair of electrodes for connection is prepared in advance. That is to say, the two-terminal elements for shortcircuit is wired as LEDs are mounted, and thus, the work for electrically connecting the main terminal to the sub-terminal with an external wire, such as a lead, is unnecessary.

Furthermore, in the above described LED module, it is preferable for a third sub-terminal for connection to an external circuit to be formed in the vicinity of the first side of the insulating substrate, and a second passing wire for electrically connecting the second main terminal or second connecting wire to the third sub-terminal is formed on the insulating substrate, or for a third sub-terminal for connection to an external circuit to be formed in the vicinity of the second side of the insulating substrate, and a second passing wire for electrically connecting the first main terminal or first connecting wire to the third sub-terminal is formed on the insulating substrate.

When a third sub-terminal and second passing wire are additionally provided, as described above, the second passing wire can also be used as part of the external wires, in addition to the first passing wire, and therefore, the external wires required to align a number of LED modules can further be made shorter. In particular, in the case where a number of LED modules are aligned in a line in such a direction as to be at a distance from the control substrate and all of the LEDs mounted in these LED modules are connected in series, as described above, the first or second main terminal and the first or second sub-terminal located in the vicinity of the farther one of the first and second sides of the LED module located farthest from the control substrate can be electrically connected by changing the first or second sub-terminal of the farthest-located LED module to the third sub-terminal during the work of connecting the first and second sub-terminals between the farthest-located LED module and the next-to-farthest LED module. Furthermore, in the case where a number of LED modules are aligned in a line in such a direction as to be at a distance from the control substrate, and columns of LEDs that are connected in series in the LED modules are connected in parallel, the external wires can be made much shorter.

Furthermore, in the above characterized LED module, it is preferable for the three or more connecting wires to be formed on the surface on one side of the insulating substrate, and the first passing wire is formed on the surface of the other side of the insulating substrate. Here, the first main terminal, the second main terminal and the three or more connecting wires may be formed on the same surface, and the first sub-terminal, the second sub-terminal and the first passing wire may be formed on the same surface. Thus, the surface on the other side of the insulating substrate can be used exclusively by the first passing wire, and therefore, the area for wires can be increased greatly. As a result, the heat within the insulating substrate heated by emitting heat from the LEDs mounted on the surface on one side of the insulating substrate can be released on the other side of the insulating substrate through the first passing wire, so that the LED module has better heat releasing performance. Furthermore, a width of the first passing wire can be made wider, and thus the impedance of the first passing wire lowered.

Furthermore, in the above characterized LED module, it is preferable for a plurality of through holes of which the inner wall surfaces are coated with a metal to be created in the insulating substrate. As a result, the heat emitted from the LEDs mounted on the surface on one side of the insulating substrate can be conveyed to the other side through the through holes and released, and thus, the LED module has better heat releasing performance. Furthermore, it is preferable for the first passing wire to be formed on the both surfaces of the insulating substrate, and the first passing wire formed on the surface on one side of the insulating substrate and the first passing wire formed on the surface on the other side of the insulating substrate are electrically connected via a plurality of through holes of which the inner wall surfaces are coated with a metal, and which are created in the insulating substrate. When first passing wires are provided on the two surfaces of the insulating substrate and connected via through holes, the LED module has even better heat releasing performance, and the impedance of the first passing wire can be lowered even more.

Furthermore, in the above characterized LED module, it is preferable for the first passing wire formed on the surface on the other side of the insulating substrate to be provided with a protrusion that protrudes into the insulating substrate. When the first passing wire formed on the surface on the other side of the insulating substrate is provided with a protrusion, the area of contact between the first passing wire and the insulating substrate increases, and therefore, the heat of the insulating substrate heated by emitting heat from the LEDs mounted on the surface on one side of the insulating substrate can be released more efficiently on the other side of the insulating substrate through the first passing wire.

Furthermore, the present invention provides an LED light source apparatus characterized in that LED module columns are formed such that a plurality of the above characterized LED modules are aligned in a first direction so that the first side of the LED module is in the proximity of the second side of the next LED module, the main terminal provided in the vicinity of the first side of the LED module and the main terminal provided in the vicinity of the second side of the next LED module are electrically connected, and the sub-terminal provided in the vicinity of the first side of the LED module and the sub-terminal provided in the vicinity of the second side of the next LED module are electrically connected, and a plurality of the LED module columns are aligned in the second direction, which is perpendicular to the first direction, so that the plurality of LEDs mounted in the LED modules are aligned in a plane.

The above characterized LED light source apparatus can provide a simple wire structure where external wires between LED modules and the control substrate or between LED modules can be much shorter.

BRIEF DESCRIPTION OF THE DRAWINGS

FIG. 9 is a schematic plan diagram showing the structure of the LED module according to the third embodiment of the present invention;

FIG. 14 is a diagram showing an example of connection where four LED modules, as shown in FIG. 12, are connected in series;

FIG. 18 is a diagram showing an example of connection where four LED modules, as shown in FIG. 15, are connected in parallel;

FIG. 20 is a diagram showing an example of connection where two LED modules, as shown in FIG. 19, are connected in series;

FIG. 24 is a schematic circuit diagram showing the structure of the drive circuit on a control substrate;

DETAILED DESCRIPTION OF THE INVENTION

Figure 25A:
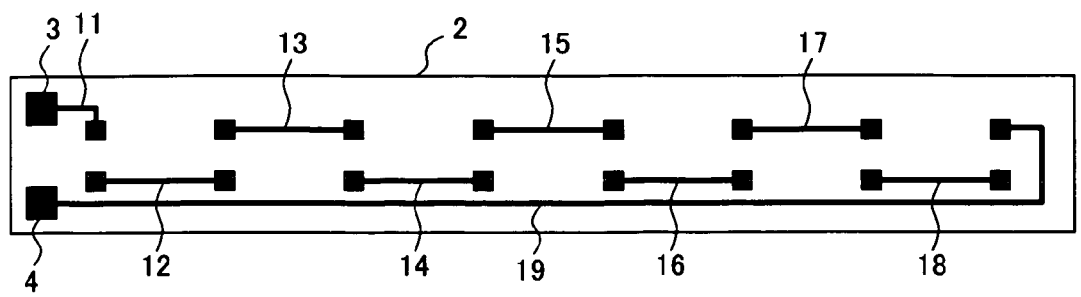
FIG. 25 is a schematic plan diagram showing an example of the structure of a conventional LED module.
Figure 25B:
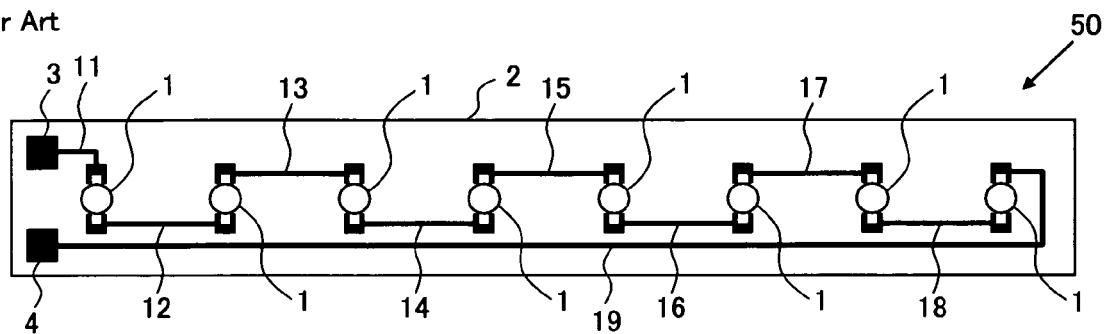
Figure 26A:
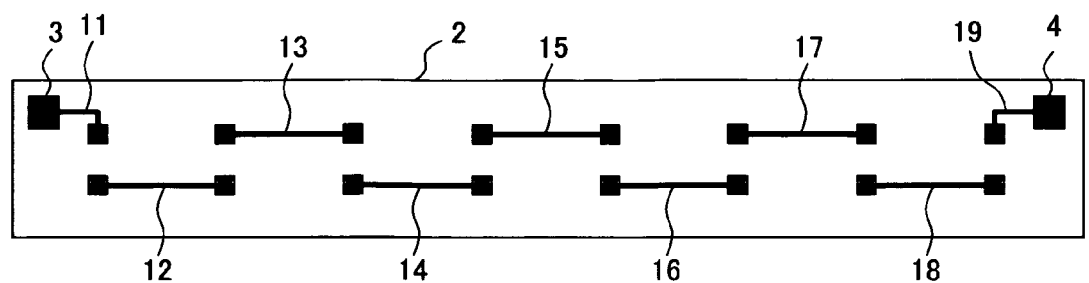
FIG. 26 is a schematic plan diagram showing another example of the structure of a conventional LED module.
Figure 26B:
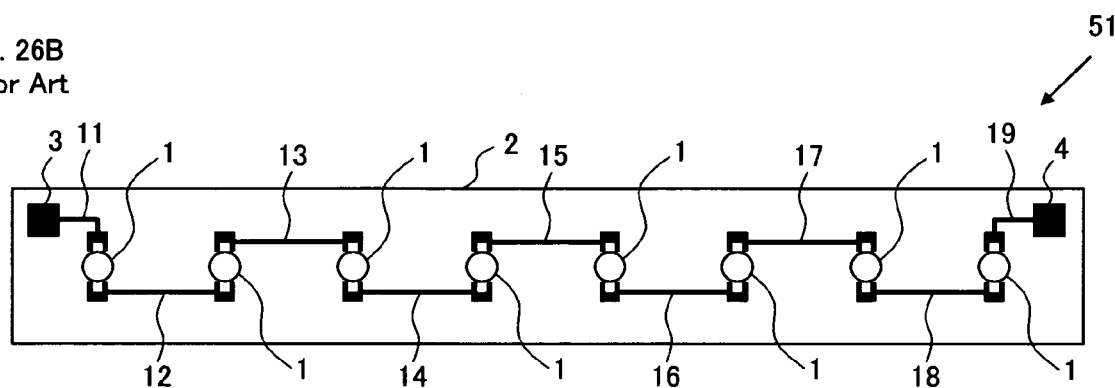

The LED modules and LED light source apparatuses according to the embodiments of the present invention are described below in reference to the drawings. Here in the following, the same symbols are attached to the same portions in the conventional LED modules shown in FIGS. 25 and 26 and those in the embodiments in order to make the description easier to understand.

First Embodiment

Figure 1A:
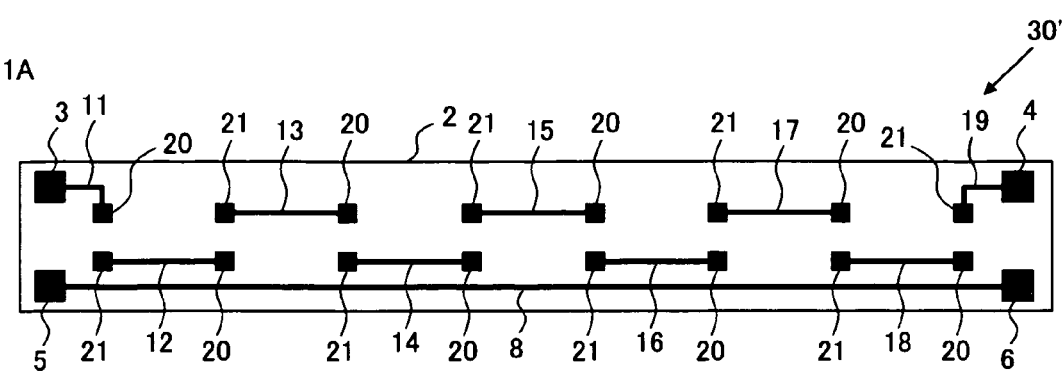
FIG. 1 is a schematic plan diagram showing the structure of the LED module according to the first embodiment of the present invention.
Figure 1B:
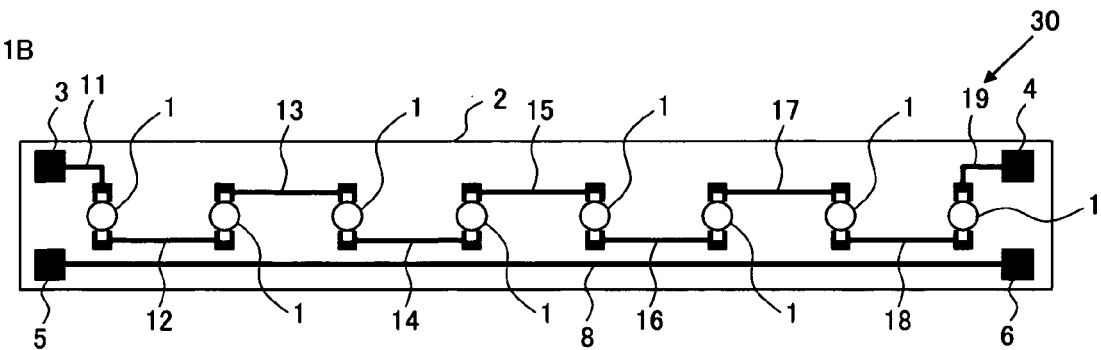
Figure 1B:
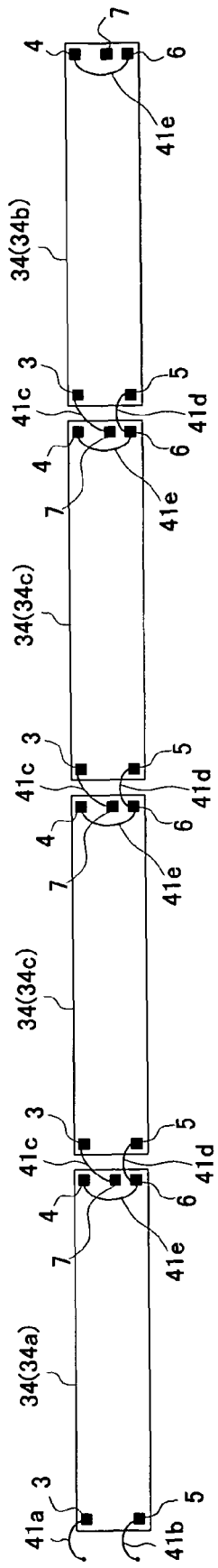
Figure 19A:
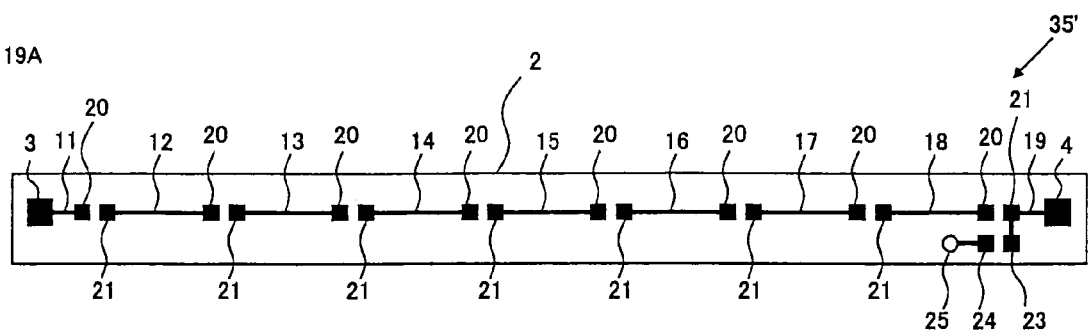
FIG. 19 is a schematic plan diagram showing the structure of the LED module according to the sixth embodiment of the present invention.
Figure 19B:
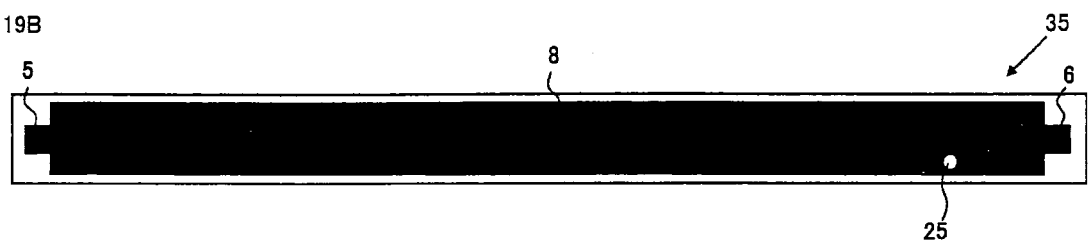
Figure 19C:
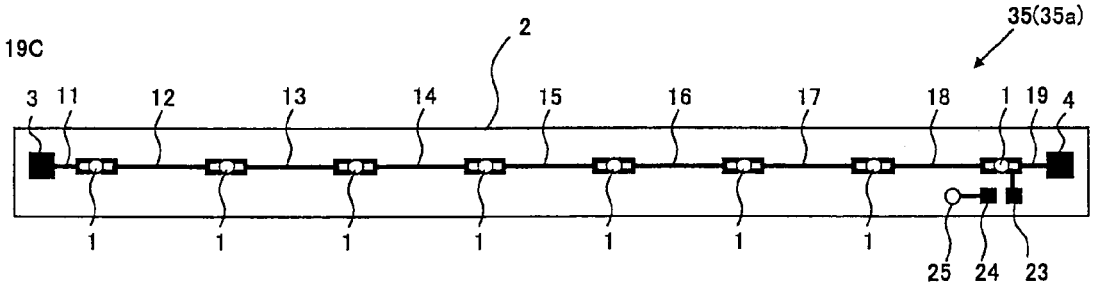
Figure 19D:
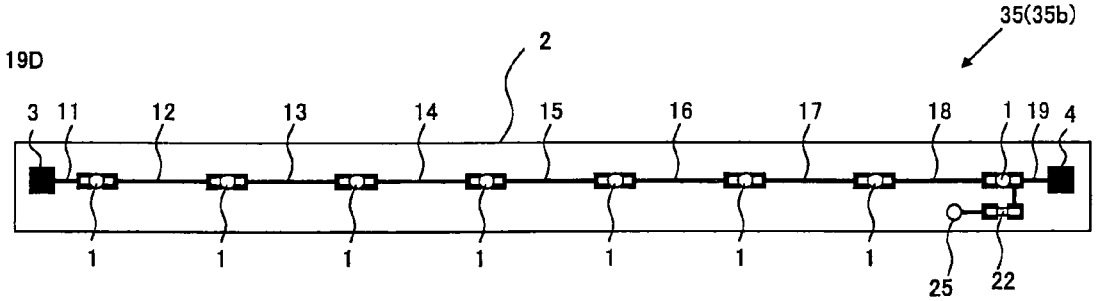

FIG. 1 is a schematic diagram showing the structure of the LED module according to the first embodiment of the present invention. FIG. 1A shows a printed wiring board 30' before LEDs are mounted, and FIG. 1B shows an LED module 30 after LEDs 1 have been mounted.

A printed wiring board 30' comprises an insulating substrate 2 on which nine connecting wires 11 to 19 for connecting eight LEDs 1 in series, four terminals including a first main terminal 3, a second main terminal 4, a first sub-terminal 5 and a second sub-terminal 6 for the connection to an external circuit and a first passing wire 8 for electrically connecting the first sub-terminal 5 to the second sub-terminal 6 are formed. The insulating substrate 2 is formed of an insulating material, such as glass epoxy, and the connecting wires 11 to 19, the four terminals 3 to 6 and the first passing wire 8 are formed of a metal film, such as a copper foil.

The connecting wires 11 to 19 are aligned side by side at a distance from each other with the terminals in close proximity. One end of the left connecting wire 11 (corresponding to the first connecting wire) is connected to the first main terminal 3, and an electrode 20 for the connection to the anode of one LED is formed at the other end. An electrode 21 for the connection to the cathode of an LED is formed at one end of each of the seven connecting wires 12 to 18 in the middle, and an electrode 20 for the connection to the anode of an LED is formed at the other end of each of the seven connecting wires 12 to 18. One end of the right connecting wire 19 (corresponding to the second connecting wire) is connected to the second main terminal 4, and an electrode 21 for the connection to the cathode of one LED is formed at the other end. The electrodes 20 and 21 are terminals of the connecting wires 11 to 19 and are formed of the same material. The anode and cathode of an LED are connected between electrodes 20 and 21 provided at the ends, which are in close proximity, of adjacent connecting wires so that eight LEDs 1 are connected in series in the forward direction between the first main terminal 3 and the second main terminal 4. Accordingly, in the present embodiment, the first main terminal 3 functions as an anode terminal and the second main terminal 4 functions as a cathode terminal.

The first main terminal 3 and the second main terminal 4 are placed separately on the two facing sides of the insulating substrate 2, and the first sub-terminal 5 and the second sub-terminal 6 are placed separately on the two facing sides of the insulating substrate 2 so that the connecting wires 11 to 19 and the first passing wire 8 are formed so as to cross the insulating substrate 2 in the longitudinal direction.

In the present embodiment, LEDs 1 are of a surface mounted type, and the anode and cathode of the LEDs 1 are electrically connected to electrodes 20 and 21 formed of a flat metal film (land) through solder reflow or the like, and thus, LEDs 1 are surface-mounted between electrodes 20 and 21. Here, in the case where the LEDs 1 are of a lead type, the electrodes 20 and 21 are formed of a metal film (land) for soldering with a through hole at the center, which is created so that a lead terminal can be inserted.

Figure 2:
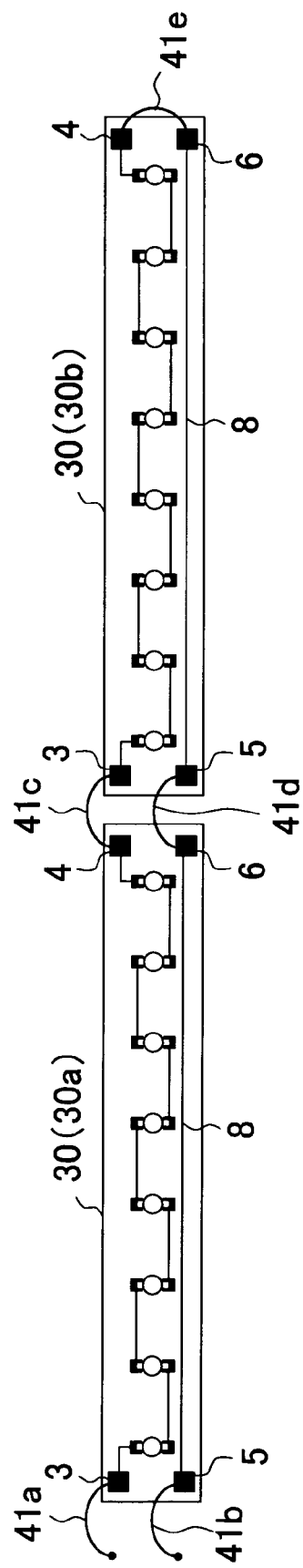
FIG. 2 is a diagram showing an example of connection where two LED modules, as shown in FIG. 1, are connected in series.

Next, in the case where two LED modules 30, as shown in FIG. 1, are connected so that sixteen LEDs in total are connected in series, the method for connecting external wires 41a to 41e is described in reference to FIG. 2.

External wires 41a and 41b connect the anode drive terminal and cathode terminal on the control substrate, not shown, for driving the LEDs in the LED modules 30 and controlling the light emission to the first main terminal 3 of one LED module 30a and the second main terminal 4 of the other LED module 30b, respectively. In the present embodiment, the external wire 41a is directly connected to the first main terminal 3 of the LED module 30a, and the external wire 41b is directly connected to the first sub-terminal 5 of the LED module 30a.

External wires 41c and 41d connect the two LED modules 30a and 30b. In the present embodiment, the external wire 41c connects the second main terminal 4 of the LED module 30a directly to the first main terminal 3 of the LED module 30b, while the external wire 41d connects the second sub-terminal 6 of the LED module 30a directly to the first sub-terminal 5 of the LED module 30b. The external wire 41e terminates at the second main terminal 4 and the second sub-terminal 6 placed on the sides of the LED module 30b farthest from the control substrate and connects the two terminals for shortcircuit.

The external wire 41c allows the sixteen LEDs 1 to be connected in series between the first main terminal 3 of the LED module 30a and the second main terminal 4 of the LED module 30b. The external wires 41d and 41e electrically connect the second main terminal 4 of the LED module 30b to the first sub-terminal 5 of the LED module 30a via the first passing wires 8 of the two LED modules 30a and 30b and electrically connect the external wire 41b to the second main terminal 4 of the LED module 30b. As a result, the sixteen LEDs connected in series can be driven and controlled from the control substrate by means of five short external wires 41a to 41e.

The methods for connecting the external wires 41a to 41e to the terminals 3 to 6 of the LED modules 30 can include a method for soldering the ends of the leads to the surface of the terminals in the case where the external wires 41a to 41e are leads, and a method for connecting the first two-pinned connector to the second two-pinned connector between two adjacent LED modules 30 when the first two-pinned connector connected to the first main terminal 3 and the first sub-terminal 5 is provided on one of the two facing sides of the insulating substrate 2, and the second two-pinned connector connected to the second main terminal 4 and the second sub-terminal 6 is provided on the other of the two facing sides of the insulating substrate 2 in the case where the external wires 41a to 41e are formed of two-pinned connectors.

Figure 29:
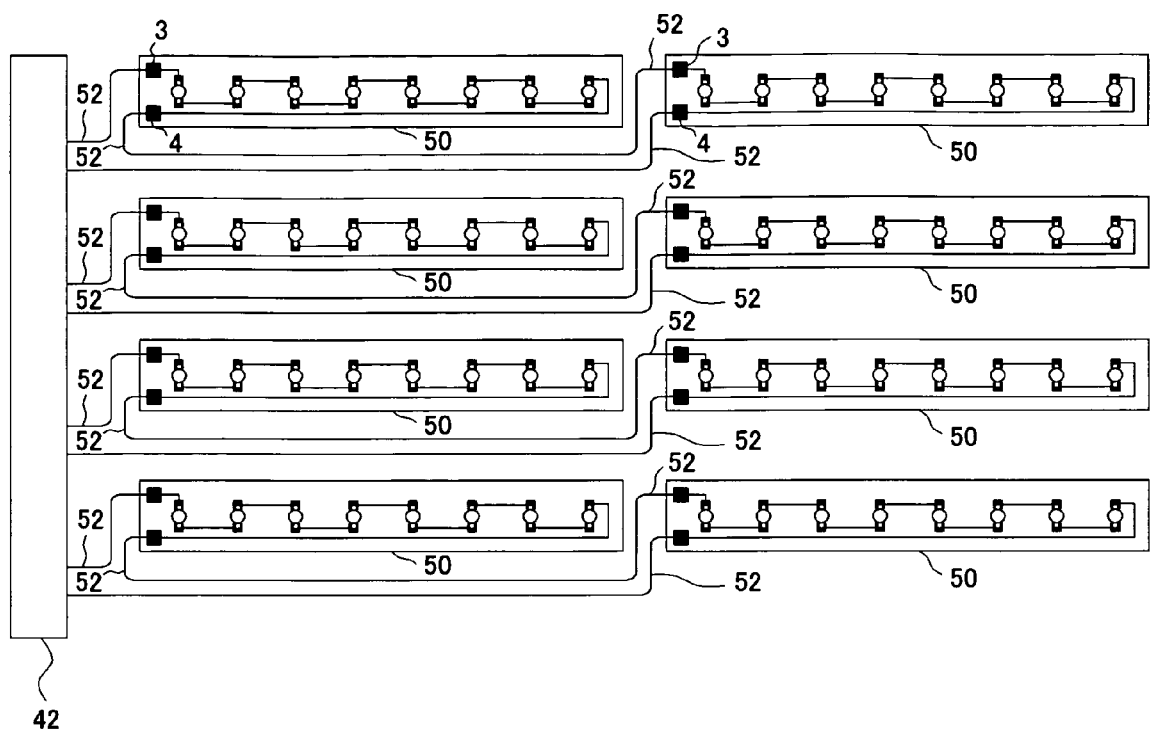
FIG. 29 is a diagram showing an example of connection where eight LED modules, as shown in FIG. 25, are connected in series-parallel.
Figure 30:
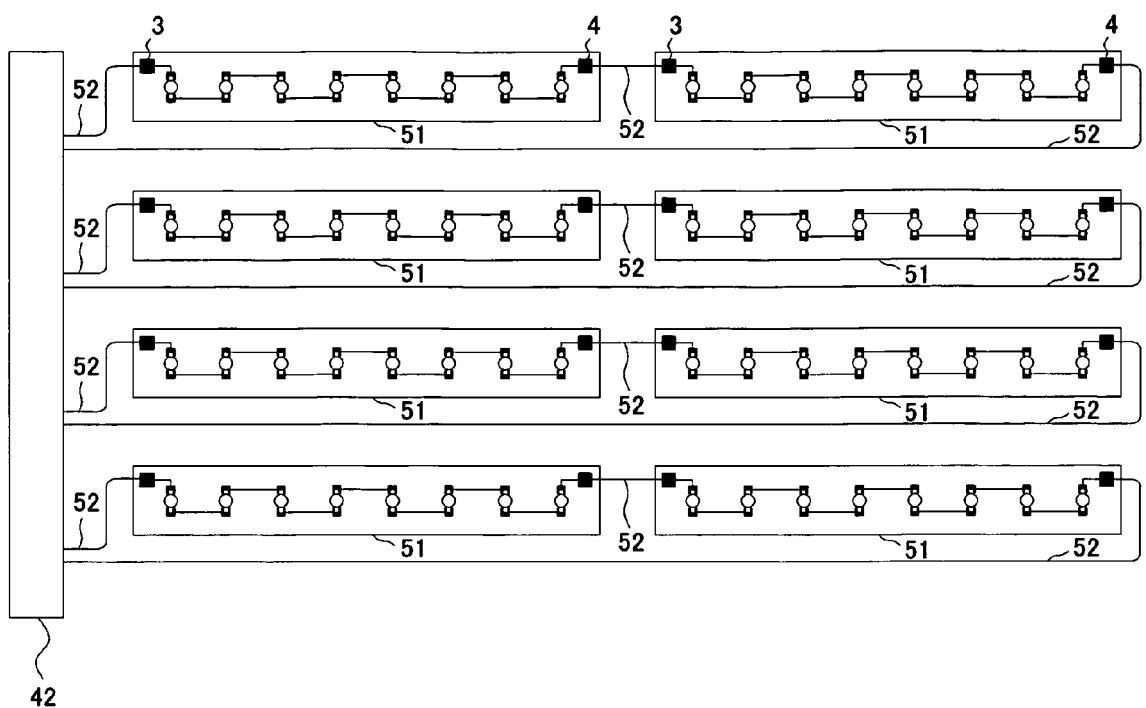
FIG. 30 is a diagram showing an example of connection where eight LED modules, as shown in FIG. 26, are connected in series-parallel.

It can be seen that the external wires are made much shorter in the configuration shown in FIG. 2 when compared to the conventional configurations shown in FIGS. 29 and 30.

Figure 3:
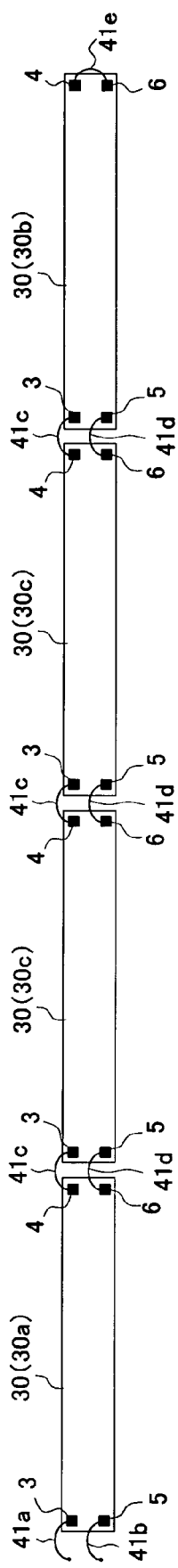
FIG. 3 is a diagram showing an example of connection where four LED modules, as shown in FIG. 1, are connected in series.

Furthermore, in the case where three or more LED modules 30, as shown in FIG. 1, are connected so that the number of LEDs connected in series is 8n (n is an integer of 3 or greater), the third and onwards LED modules 30c are inserted between the two LED modules 30a and 30b, as shown in FIG. 3, and the second main terminal 4 of the LED module 30a and the second main terminal 4 of the LED module 30c are connected directly to the first main terminal 3 of the LED module 30 c and the first main terminal 3 of the LED module 30b, respectively, via the external wires 41c, and the second sub-terminal 6 of the LED module 30a and the second sub-terminal 6 of the LED module 30c are connected directly to the first sub-terminal 5 of the LED module 30c and the first sub-terminal 5 of the LED module 30b, respectively, via the external wires 41d as in the configuration shown in FIG. 2. Furthermore, in the case where two or more LED modules 30c are added, the second main terminal 4 of the LED module 30c is connected directly to the first main terminal 3 of the adjacent LED module 30c via the external wire 41c, and the second sub-terminal 6 of the LED module 30c is connected directly to the first sub-terminal 5 of the adjacent LED module 30c via the external wire 41d. As shown in FIG. 3, the side on which the second main terminal 4 and the second sub-terminal 6 are placed in one LED module 30 is placed in close proximity to the end on which the first main terminal 3 and the first sub-terminal 5 are placed in the next LED module 30 so that the LED modules 30 aligned in sequence are connected through external wires 41c and 41d, and thus, the number of LEDs connected in series can be easily increased. Here, LEDs 1 in the LED modules 30, connecting wires 11 to 19, electrodes 20 and 21 and first passing wires 8 are not shown in FIG. 3.

Figure 4:
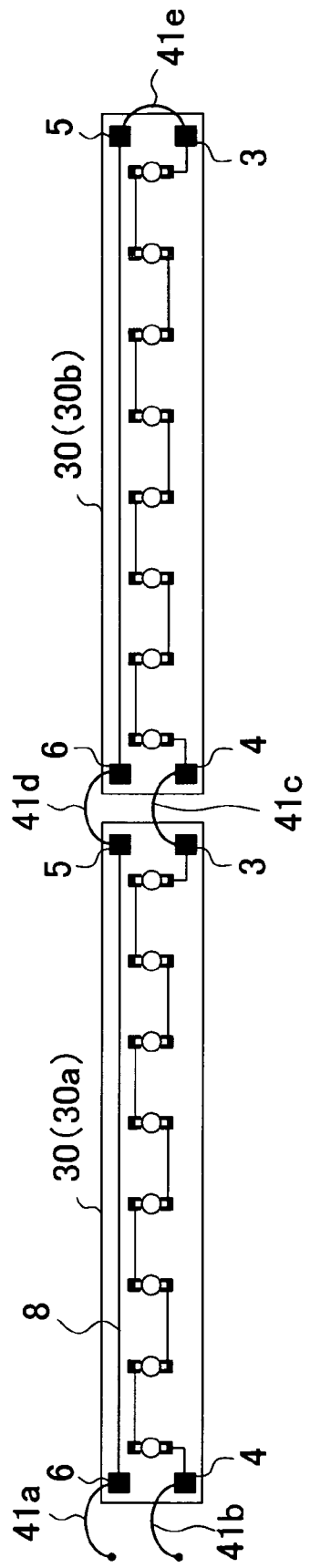
FIG. 4 is a diagram showing another example of connection where two LED modules, as shown in FIG. 1, are connected in series.
Figure 5:
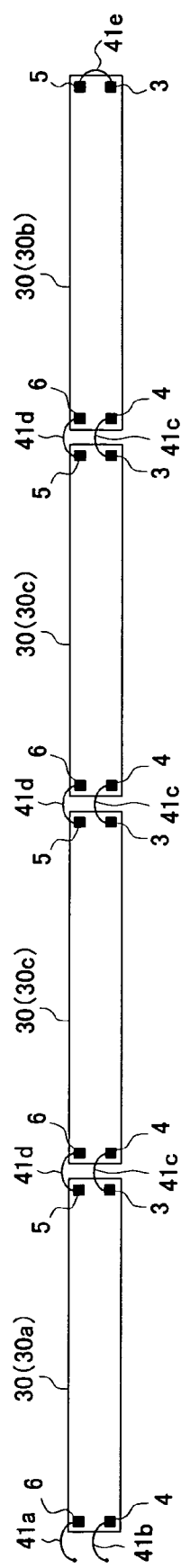
FIG. 5 is a diagram showing another example of connection where four LED modules, as shown in FIG. 1, are connected in series.

Though in the present embodiment, as shown in FIGS. 2 and 3, the external wire 41a is connected directly to the first main terminal 3 of the LED module 30a and the external wire 41b is connected directly to the first sub-terminal 5 of the LED module 30a in the configuration, as shown in FIGS. 4 and 5, the LED modules 30 may be turned 180 degrees so that the external wire 41a is connected directly to the second sub-terminal 6 of the LED module 30a, and the external wire 41b is connected directly to the second main terminal 4 of the LED module 30a. In this case, the external wires 41c and 41d connect the first main terminal 3 and the first sub-terminal 5 to the second main terminal 4 and the second sub-terminal 6, respectively, between adjacent LED modules 30 as in the configurations shown in FIGS. 2 and 3, while the external wire 41e connects the first main terminal 3 to the first sub-terminal 5, which are located on the side of the LED module 30b farthest from the control substrate, unlike in the configurations shown in FIGS. 2 and 3.

Second Embodiment

Figure 6A:
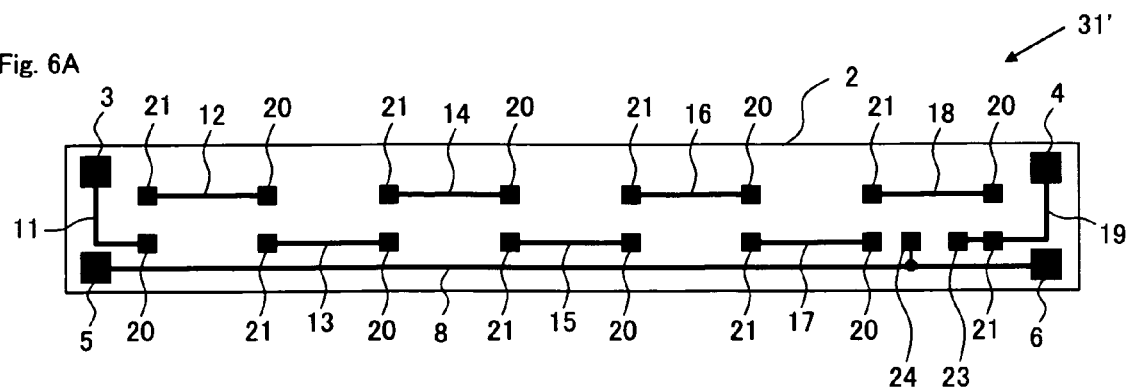
FIG. 6 is a schematic plan diagram showing the structure of the LED module according to the second embodiment of the present invention.
Figure 6B:
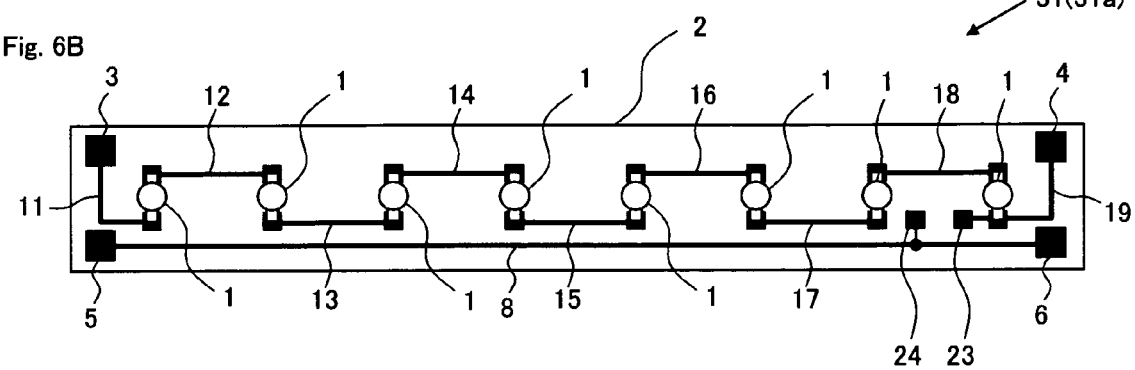
Figure 6C:
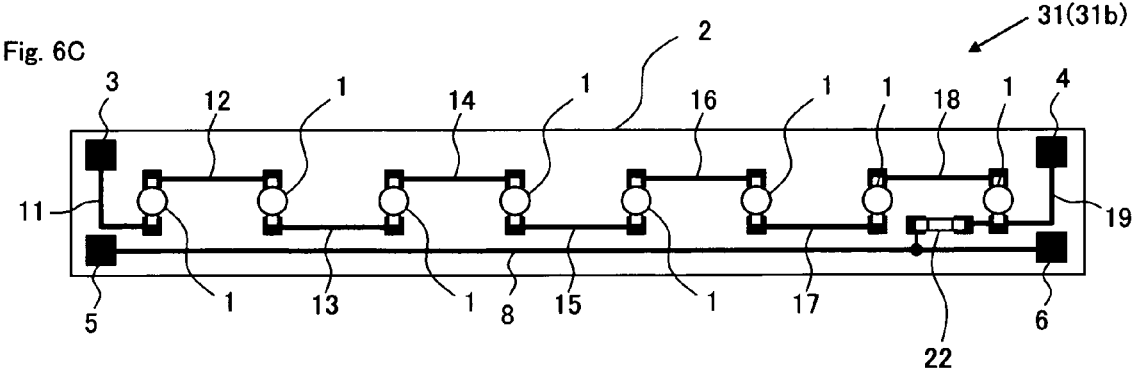

Next, the LED module according to the second embodiment of the present invention is described. FIG. 6 schematically shows the structure of the LED module according to the second embodiment of the present invention. FIG. 6A shows a printed wiring board 31' before LEDs are mounted, FIG. 6B shows an LED module 31 (31a) after LEDs 1 have been mounted, and FIG. 6C shows an LED module 31 (31b) after LEDs 1 and a short-circuit element 22 have been mounted.

A printed wiring board 31' comprises an insulating substrate 2 on which nine connecting wires 11 to 19 for connecting eight LEDs 1 in series, electrodes 20 and 21, four terminals including a first main terminal 3, a second main terminal 4, a first sub-terminal 5 and a second sub-terminal 6 for the connection to an external circuit, a first passing wire 8 for electrically connecting the first sub-terminal 5 to the second sub-terminal 6, an electrode 23 for an electrical connection to the connecting wire 19 (corresponding to second connecting wire), and an electrode 24 for an electrical connection to the first passing wire 8 are formed. The insulating substrate 2 is formed of an insulating material, such as glass epoxy, and the connecting wires 11 to 19, the four terminals 3 to 6, the first passing wire 8 and the electrodes 20, 21, 23 and 24 are formed of a metal film, such as a copper foil.

The printed wiring board 31' in the second embodiment is different from the printed wiring board 30' in the first embodiment in that new electrodes 23 and 24 have been added, and the components other than the electrodes 23 and 24 are the same as in the first embodiment, and therefore, descriptions thereof are not repeated.

The electrodes 23 and 24 are electrodes for mounting the short-circuit element 22 and are provided as a pair in close proximity to each other in the same manner as the electrodes 20 and 21. The short-circuit element 22 is a surface mounted two-terminal type element as the LEDs 1 where the resistor in a chip-like resistor element is replaced with a conductor so that the resistance value is substantially $0\Omega$, and it may be replaced with a jumper wire or the like. The short-circuit element 22 is electrically connected to the electrodes 23 and 24 through solder reflow at the same time when LEDs 1 are mounted on the electrodes 20 and 21, and thus, the LED module 31b is formed. In the second embodiment, two types of LED modules 31 including LED modules 31b on which a short-circuit element 22 is mounted and LED modules 31a on which a short-circuit element 22 is not mounted are fabricated using the same printed wiring boards 31'.

Figure 7:
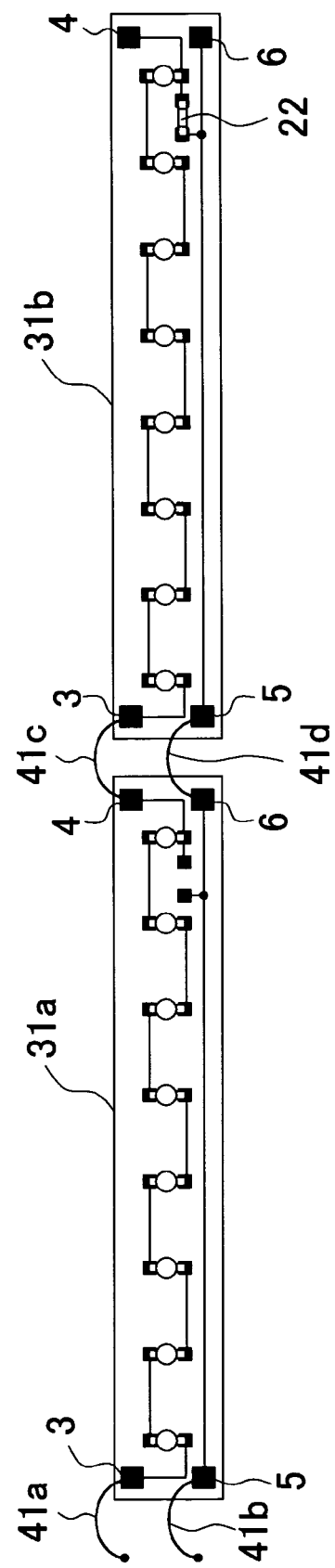
FIG. 7 is a diagram showing an example of connection where two LED modules, as shown in FIG. 6, are connected in series.

Next, a method for connecting external wires 41a to 41d in the case where one LED module 31a and one LED module 31b, as shown in FIG. 6, are connected so that sixteen LEDs in total are connected in series is described in reference to FIG. 7.

As for the external wires 41a to 41d, in the same manner as in the first embodiment, the external wire 41a is connected directly to the first main terminal 3 of the LED module 31a, the external wire 41b is connected directly to the first sub-terminal 5 of the LED module 31a, the external wire 41c connects the second main terminal 4 of the LED module 31a directly to the first main terminal 3 of the LED module 31b, and the external wire 41d connects the second sub-terminal 6 of the LED module 31a directly to the first sub-terminal 5 of the LED module 31b. In the first embodiment, the second main terminal 4 and the second sub-terminal 6 located on the side of the LED module 30b farthest from the control substrate are connected for shortcircuit through the external wire 41e, while the second embodiment is different from the first embodiment in that the second main terminal 4 and the second sub-terminal 6 located in the side of the LED module 31b farthest from the control substrate are connected by making the short-circuit element 22 make a connection between the electrodes 23 and 24 instead of through an external wire, and thus, the second main terminal 4 electrically connected to the electrode 23 via the connecting wire 19 and the second sub-terminal 6 electrically connected to the electrode 24 via the first passing wire 8 are connected to each other. As a result, this shortcircuit process can be carried out at the same time as the LEDs 1 are mounted on the printed wiring board 31', and therefore, a process for connection is unnecessary for the external wire 41e, and the process for connection for the external wires 41a to 41d can be simplified.

The external wire 41c allows sixteen LEDs 1 to be connected in series between the first main terminal 3 of the LED module 31a and the second main terminal 4 of the LED module 31b, and the external wire 41d and the short-circuit element 22 allow the second main terminal 4 of the LED module 31b and the first sub-terminal 5 of the LED module 31a to be electrically connected via the first passing wires 8 of the two LED modules 31a and 31b so that the external wire 41b is electrically connected to the second main terminal 4 of the LED module 31b. As a result, sixteen LEDs connected in series can be driven and controlled from the control substrate through the four short external wires 41*a* to 41*d* and the short-circuit element 22.

Figure 8:
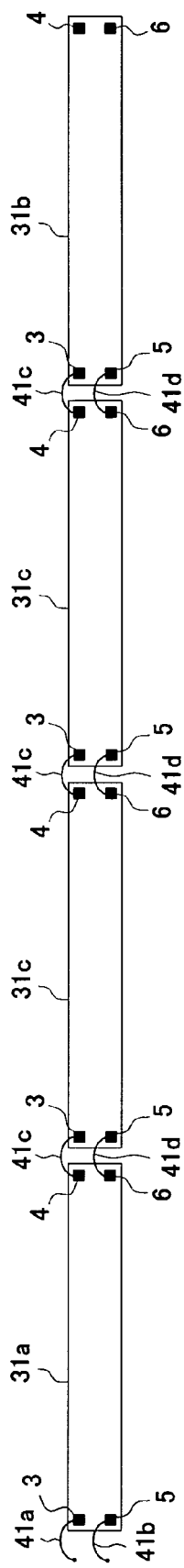
FIG. 8 is a diagram showing an example of connection where four LED modules, as shown in FIG. 6, are connected in series.

The second embodiment is different from the first embodiment only in the manner how a shortcircuit process is carried out between the second main terminal 4 and the second sub-terminal 6 placed on the side of the LED module 31*b* (30*b*) farthest from the control substrate, and therefore, it can be seen that the external wires are made much shorter as compared to the conventional configurations shown in FIGS. 29 and 30 in the same manner as in the first embodiment. Furthermore, in the case where three or more LED modules 31, as shown in FIG. 6, are connected so that the number of LEDs connected in series is 8*n* (n is an integer of 3 or greater), the third and onwards LED modules 31*c* are inserted between the two LED modules 31*a* and 31*b*, as shown in FIG. 8, and the second main terminal 4 of the LED module 31*a* and the second main terminal 4 of the LED module 31*c* are connected directly to the first main terminal 3 of the LED module 31*c* and the first main terminal 3 of the LED module 31*b*, respectively, via the external wires 41*c*, and the second sub-terminal 6 of the LED module 31*a* and the second sub-terminal 6 of the LED module 31*c* are connected directly to the first sub-terminal 5 of the LED module 31*c* and the first sub-terminal 5 of the LED module 31*b*, respectively, via the external wires 41*d* as in the configuration shown in FIG. 7. Furthermore, in the case where two or more LED modules 31*c* are added, the second main terminal 4 of the LED module 31*c* is connected directly to the first main terminal 3 of the adjacent LED module 31*c* via the external wire 41*c*, and the second sub-terminal 6 of the LED module 31*c* is connected directly to the first sub-terminal 5 of the adjacent LED module 31*c* via the external wire 41*d*. As shown in FIG. 8, the side on which the second main terminal 4 and the second sub-terminal 6 are located in one LED module 31 and the side on which the first main terminal 3 and the first sub-terminal 5 are located in the next LED module 31 are placed in close proximity so that the LED modules 31 aligned in sequence are connected via the external wires 41*c* and 41*d*, and thus, the number of LEDs connected in series can be easily increased. Here, the third and onwards LED modules 31*c* inserted between the two LED modules 31*a* and 31*b* are LED modules 31 on which a short-circuit element 22 is not mounted in the same manner as the LED modules 31*a*. Here, LEDs 1 in the LED module 31, connecting wires 11 to 19, electrodes 20 and 21, first passing wires 8, short-circuit elements 22 and electrodes 23 and 24 are not shown in FIG. 8.

Third Embodiment

Next, the LED module according to the third embodiment of the present invention is described. FIG. 9 schematically shows the structure of the LED module according to the third embodiment of the present invention. In the second embodiment, the electrode 23 is provided so as to be electrically connected to the connecting wire 19 (corresponding to the second connecting wire) and formed in close proximity to the electrode 24 electrically connected to the first passing wire 8, as shown in FIG. 6, while in the third embodiment, the electrode 23 is provided so as to be electrically connected to the connecting wire 11 (corresponding to first connecting wire), as shown in FIG. 9. FIG. 9A shows a printed wiring board 32' before LEDs are mounted, FIG. 9B shows an LED module 32 (32*a*) after LEDs 1 have been mounted, and FIG. 9C shows an LED module 32 (32*b*) after LEDs 1 and a short-circuit element 22 have been mounted.

The printed wiring board 32' in the third embodiment is different from the printed wiring board 31' in the second embodiment only in the object to which the electrode 23 is electrically connected, and the components of the LED module 32 are the same as in the first and second embodiments, and therefore, the descriptions thereof are not repeated.

Figure 10:
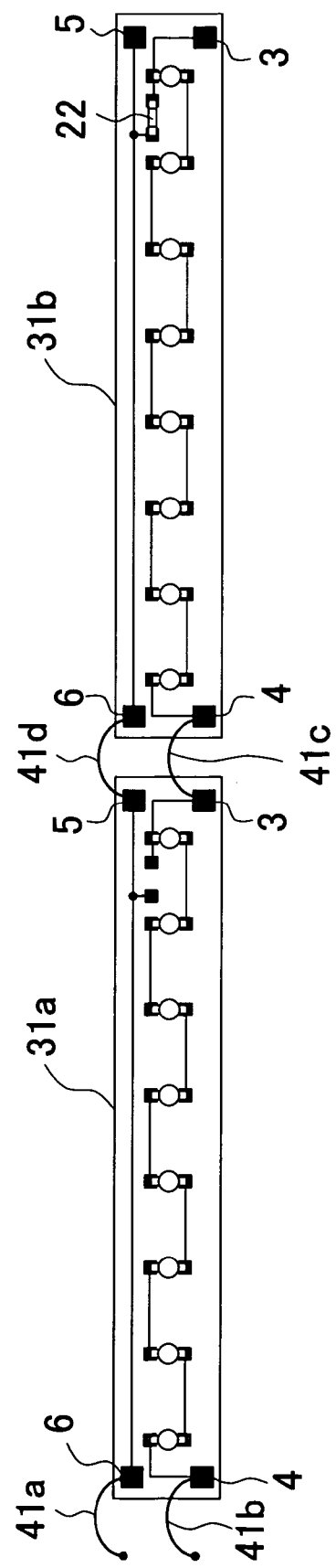
FIG. 10 is a diagram showing an example of connection where two LED modules, as shown in FIG. 9, are connected in series.

Next, a method for connecting external wires 41*a* to 41*d* in the case where one LED module 32*a* and one LED module 32*b*, as shown in FIG. 9, are connected to each other so that sixteen LEDs in total are connected in series is described in reference to FIG. 10. The method for connecting the external wires 41*a* to 41*b* is different from that in the second embodiment and similar to the method for connection in the first embodiment shown in FIG. 4. The external wire 41*a* is connected directly to the second sub-terminal 6 of the LED module 32*a*, and the external wire 41*b* is connected directly to the second main terminal 4 of the LED module 32*a*. The external wire 41*c* connects the first main terminal 3 of the LED module 32*a* directly to the second main terminal 4 of the LED module 32*b*, and the external wire 41*d* connects the first sub-terminal 5 of the LED module 32*a* directly to the second sub-terminal 6 of the LED module 32*b*.

The method for connection in the third embodiment is different from that in the first embodiment in that, in the first embodiment shown in FIG. 4, the first main terminal 3 and the first sub-terminal 5 located on the side of the LED module 30*b* farthest from the control substrate are connected to each other through the external wire 41*e*, while in the third embodiment, the first main terminal 3 and the first sub-terminal 5 located on the side of the LED module 32*b* farthest from the control substrate are connected to each other by making the short-circuit element 22 make a connection between the electrodes 23 and 24 instead of through an external wire, and thus, the first main terminal 3 electrically connected to the electrode 23 via the connecting wire 11 and the first sub-terminal 5 electrically connected to the electrode 24 via the first passing wire 8 are connected to each other. As a result, the process for shortcircuit can be carried out at the same time as LEDs 1 are mounted on the printed wiring board 32', and therefore, a process for connection is unnecessary for the external wire 41*e*, and the process for connection for the external wires 41*a* to 41*d* can be simplified.

The external wire 41*c* allows sixteen LEDs 1 to be connected in series in the opposite direction of that in the second embodiment between the second main terminal 4 of the LED module 32*a* and the first main terminal 3 of the LED module 32*b*, and the external wire 41*d* and the short-circuit element 22 electrically connect the first main terminal 3 of the LED module 32*b* to the second sub-terminal 6 of the LED module 32*a* via the first passing wires 8 of the two LED modules 32*a* and 32*b* so that the external wire 41*a* and the first main terminal 3 of the LED module 32*b* are electrically connected to each other. As a result, the sixteen LEDs connected in series can be driven and controlled from the control substrate through the four short external wires 41*a* to 41*d* and the short-circuit element 22.

Figure 11:
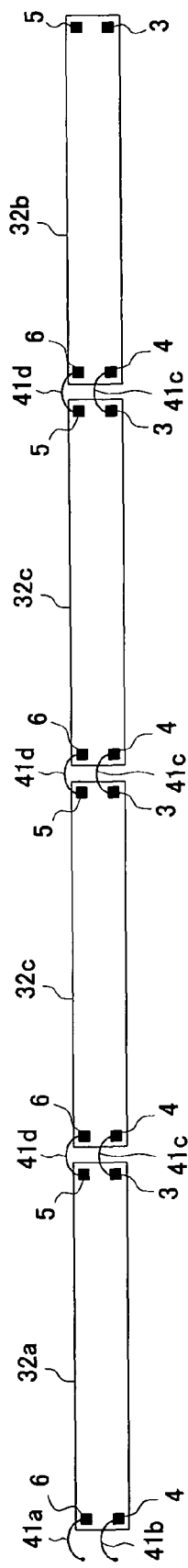
FIG. 11 is a diagram showing an example of connection where four LED modules, as shown in FIG. 9, are connected in series.

The configuration in the third embodiment is different from that in the first embodiment shown in FIG. 4 only in the manner how the first main terminal 3 and the first sub-terminal 5 located on the side of the LED module 32*b* (30*b*) farthest from the control substrate are connected, and therefore, it can be seen, as in the first embodiment, that the external wires are made much shorter as compared to the conventional configurations shown in FIGS. 29 and 30. Furthermore, in the case where three or more LED modules 32, as shown in FIG. 9, are connected so that the number of LEDs connected in series is 8*n* (n is an integer of 3 or greater), the third and onwards LED modules 32c are inserted between the two LED modules 32a and 32b, as shown in FIG. 11, the first main terminal 3 of the LED module 32a and the first main terminal 3 of the LED module 31c are connected directly to the second main terminal 4 of the LED module 32c and the second main terminal 4 of the LED module 32b, respectively, through external wires 41c, and the first sub-terminal 5 of the LED module 32a and the first sub-terminal 5 of the LED module 32c are connected directly to the second sub-terminal 6 of the LED module 32c and the second sub-terminal 6 of the LED module 32b, respectively, through external wires 41d. Furthermore, in the case where two or more LED modules 32c are added, the first main terminal 3 of the LED module 32c and the second main terminal 4 of the adjacent LED module 32c are connected directly to each other through the external wire 41c, and the first sub-terminal 5 of the LED module 32c and the second sub-terminal 6 of the adjacent LED module 32c are connected directly to each other through the external wire 41d. As shown in FIG. 11, the side on which the first main terminal 3 and the first sub-terminal 5 are located in one LED module 32 and the side on which the second main terminal 4 and the second sub-terminal 6 are located in the next LED module 32 are placed in close proximity so that LED modules 32 aligned in sequence are connected through external wires 41c and 41d, and thus, the number of LEDs connected in series can be easily increased. Here, the third and onwards LED modules 32c inserted between the two LED modules 32a and 32b are LED modules 32 on which a short-circuit element 22 is not mounted as in the LED module 32a. Here, LEDs 1 in the LED modules 30, connecting wires 11 to 19, electrodes 20 and 21, first passing wires 8, short-circuit elements 22 and electrodes 20 and 21 are not shown in FIG. 11.

Fourth Embodiment

Figure 12A:
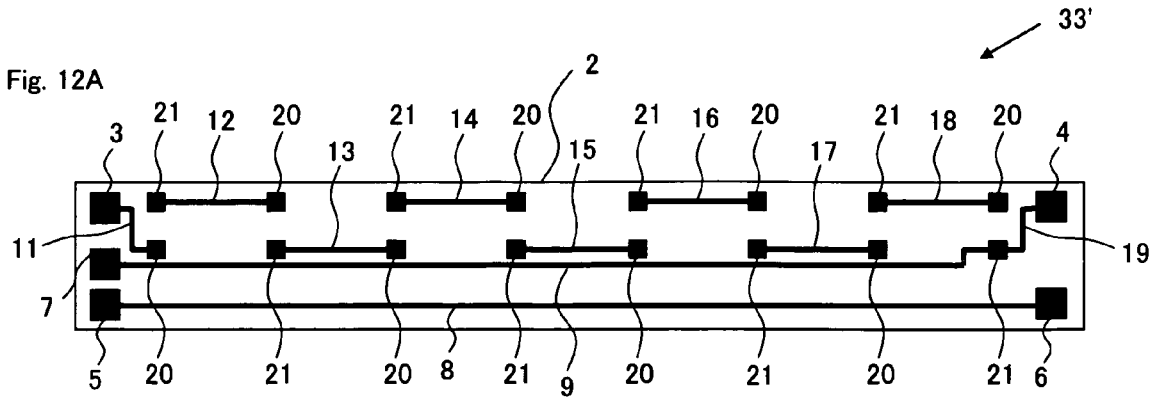
FIG. 12 is a schematic plan diagram showing the structure of the LED module according to the fourth embodiment of the present invention.
Figure 12B:
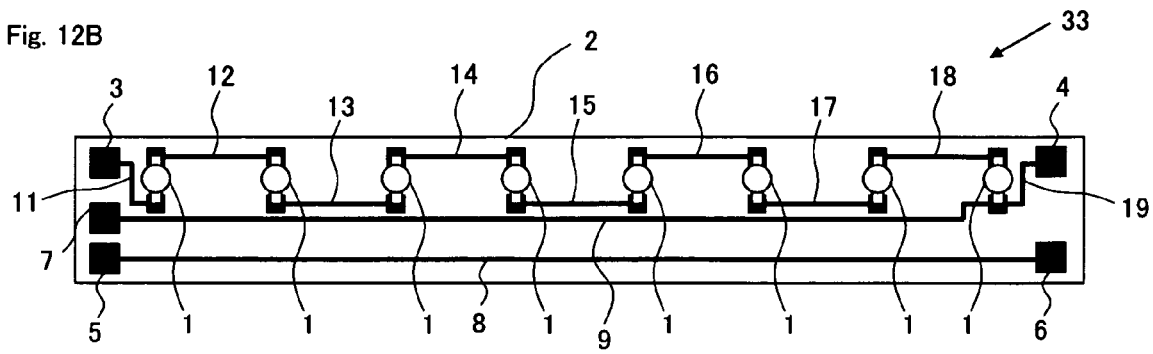

Next, the LED module according to the fourth embodiment of the present invention is described. FIG. 12 schematically shows the structure of the LED module according to the fourth embodiment of the present invention. FIG. 12A shows a printed wiring board 33' before LEDs are mounted, and FIG. 12B shows an LED module 33 after LEDs 1 have been mounted.

The printed wiring board 33' comprises an insulating substrate 2 on which nine connecting wires 11 to 19 for connecting eight LEDs 1 in series, electrodes 20 and 21, five terminals including a first main terminal 3, a second main terminal 4, a first sub-terminal 5, a second sub-terminal 6 and a third sub-terminal 7 for the connection to an external circuit, a first passing wire 8 for electrically connecting the first sub-terminal 5 to the second sub-terminal 6, and a second passing wire 9 for electrically connecting the third sub-terminal 7 to the connecting wire 19 (corresponding to the second connecting wire) are formed. In the fourth embodiment, the third sub-terminal 7 is placed in the vicinity of the same side as the first main terminal 3 and the first sub-terminal 5. That is to say, the second passing wire 9 is formed so as to cross the insulating substrate 2 in the longitudinal direction in the same manner as the first passing wire 8. The insulating substrate 2 is formed of an insulating material, such as glass epoxy, and the connecting wires 11 to 19, the five terminals 3 to 7, the first passing wire 8, the second passing wire 9 and the electrodes 20 and 21 are formed of a metal film, such as a copper foil.

The printed wiring board 33' in the fourth embodiment is different from the printed wiring board 30' in the first embodiment in that a new third sub-terminal 7 and second passing wire 9 are added, and the components other than the third sub-terminal 7 and the second passing wire 9 are the same as in the first embodiment, and therefore, the same descriptions are not repeated. The second passing wire 9 corresponds to the short-circuit element 22 in the LED module 31b in the second embodiment and has the same effects as in the case where the connecting wire 19 and the first passing wire 8 are connected through the short-circuit element 22 when used by switching the first sub-terminal 5 and the third sub-terminal 7, or has the same effects as in the case where the second main terminal 4 and the second sub-terminal 6 located on the side of the LED module 30b farthest from the control substrate in the first embodiment are connected through the external wire 41e.

Figure 13:
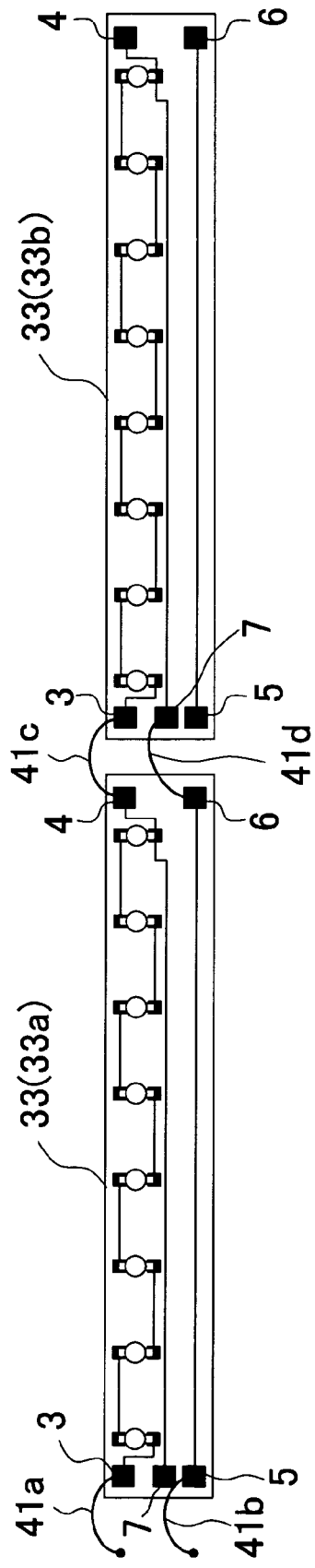
FIG. 13 is a diagram showing an example of connection where two LED modules, as shown in FIG. 12, are connected in series.

Next, in the case where two LED modules 33, as shown in FIG. 12, are connected so that sixteen LEDs in total are connected in series, a method for connecting the external wires 41a to 41d is described in reference to FIG. 13.

In the same manner as in the first and second embodiments, the external wire 41a is connected directly to the first main terminal 3 of the LED module 33a, the external wire 41b is connected directly to the first sub-terminal 5 of the LED module 33a, and the external wire 41c connects the second main terminal 4 of the LED module 34a directly to the first main terminal 3 of the LED module 33b. Unlike in the first and second embodiments, the external wire 41d connects the second sub-terminal 6 of the LED module 33a directly to the third sub-terminal 7 of the LED module 33b. Though in the first and second embodiments the external wire 41d connects the second sub-terminal 6 of the LED modules 30a and 31a directly to the first sub-terminal 5 of the LED modules 30b and 31b, and the external wire 41e or the short-circuit element 22 makes a connection between the second main terminal 4 and the second sub-terminal 6 placed on the side of the LED modules 30b and 31b farthest from the control substrate, the fourth embodiment is different from the first and second embodiments in that the external wire 41d connects the second sub-terminal 6 of the LED module 33a directly to the third sub-terminal 7 of the LED module 33b, and no process for shortcircuit is made between the second main terminal 4 and the second sub-terminal 6 located on the side of the LED module 33b farthest from the control substrate. As a result, the process for shortcircuit using the external wire 41e or the short-circuit element 22 in the first and second embodiments is unnecessary, and a process for connection for the external wires 41a to 41d can be simplified.

The external wire 41c allows sixteen LEDs 1 to be connected in series between the first main terminal 3 of the LED module 33a and the second main terminal 4 of the LED module 33b, and the external wire 41d electrically connects the second main terminal 4 of the LED module 33b to the first sub-terminal 5 of the LED module 33a via the first passing wire 8 of the LED module 33a and the second passing wire 9 of the LED module 33b so that the external wire 41b and the second main terminal 4 of the LED module 33b are electrically connected to each other. As a result, sixteen LEDs connected in series can be driven and controlled from the control substrate through four short external wires 41a to 41d.

The fourth embodiment is different from the first embodiment only in the manner how the second main terminal 4 located on the side of the LED module 33b (30b) farthest from the control substrate is electrically connected to the first sub-terminal 5 of the LED module 33a (30a) connected to the external wire 41b, and therefore, it can be seen as in the first embodiment that the external wires are made much shorter as compared to the conventional configurations shown in FIGS. 29 and 30. Furthermore, in the case where three or more LED modules 33, as shown in FIG. 12, are connected so that the number of LEDs connected in series is $8n$ (n is an integer of 3 or greater), the third and onwards LED modules 33c are inserted between two LED modules 33a and 33b, as shown in FIG. 14, the second main terminal 4 of the LED module 33a and the second main terminal 4 of the LED module 33c are connected directly to the first main terminal 3 of the LED module 33c and the first main terminal 3 of the LED module 33b, respectively, through the external wires 41c, and the second sub-terminal 6 of the LED module 33a and the second sub-terminal 6 of the LED module 33c are connected directly to the first sub-terminal 5 of the LED module 33c and the third sub-terminal 7 of the LED module 33b, respectively, through the external wires 41d. Furthermore, in the case where two or more LED modules 33c are added, the second main terminal 4 of the LED module 33c is connected directly to the first main terminal 3 of the adjacent LED module 33c through the external wire 41c, and the second sub-terminal 6 of the LED module 33c is connected directly to the first sub-terminal 5 of the adjacent LED module 33c through the external wire 41d. As shown in FIG. 14, the side on which the second main terminal 4 and the second sub-terminal 6 are located in one LED module 33 and the end on which the first main terminal 3, the first sub-terminal 5 and the third sub-terminal 7 are located in the next LED module 33 are placed in close proximity, and the LED modules 33 aligned in sequence are connected through the external wires 41c and 41d, and thus, the number of LEDs connected in series can be easily increased. Here, LEDs 1 in the LED modules 33, connecting wires 11 to 19, electrodes 20 and 21, first passing wires 8 and second passing wires 9 are omitted in FIG. 14.

Fifth Embodiment

Figure 15A:
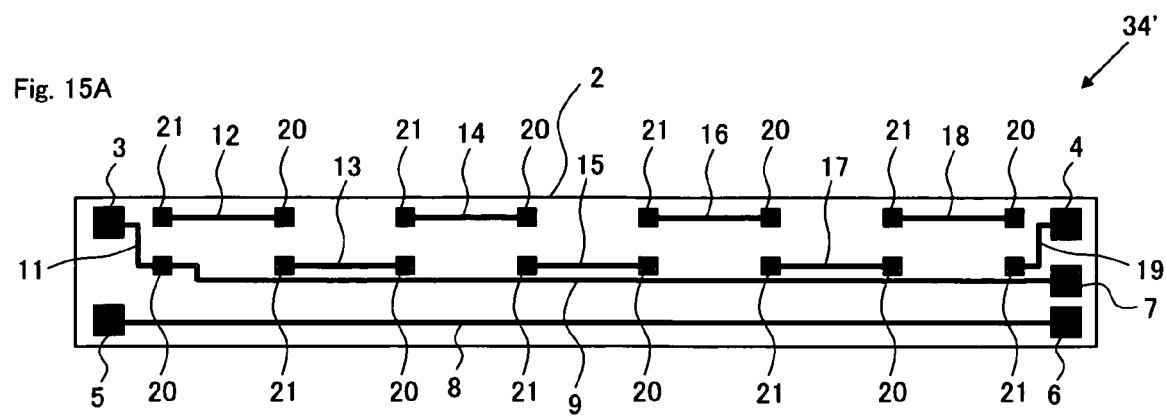
FIG. 15 is a schematic plan diagram showing the structure of the LED module according to the fifth embodiment of the present invention.
Figure 15B:
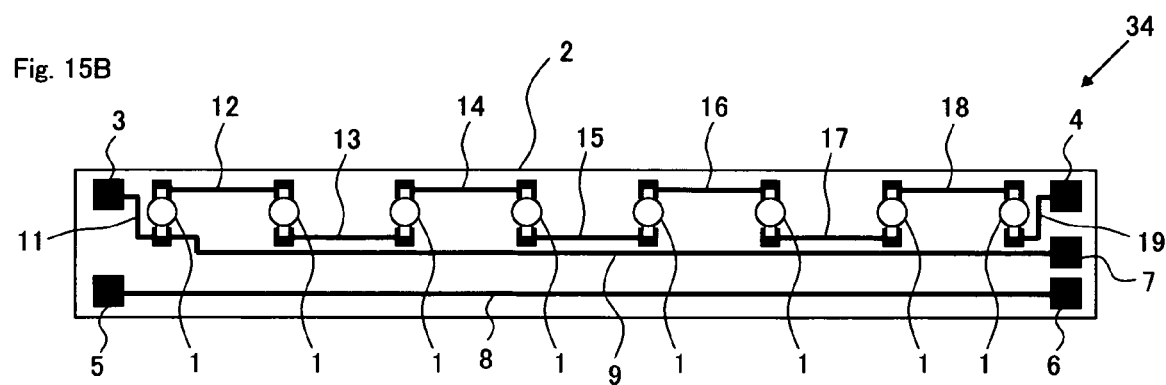

Next, the LED module according to the fifth embodiment of the present invention is described. FIG. 15 schematically shows the structure of the LED module according to the fifth embodiment of the present invention. In the fourth embodiment, as shown in FIG. 12, the third sub-terminal 7 is located in the vicinity of the same side as the first main terminal 3 and the first sub-terminal 5, and the second passing wire 9 is formed so as to electrically connect the third sub-terminal 7 to the connecting wire 19, while in the fifth embodiment, as shown in FIG. 15, the third sub-terminal 7 is located in close proximity to the same side as the second main terminal 4 and the second sub-terminal 6, and the second passing wire 9 is formed so as to electrically connect the third sub-terminal 7 to the connecting wire 11 (corresponding to the first connecting wire). FIG. 15A shows a printed wiring board 34' before LEDs are mounted, and FIG. 15B shows an LED module 34 after LEDs 1 have been mounted.

The printed wiring board 34' in the fifth embodiment is different from the printed wiring board 33' in the fourth embodiment only in the location where the third sub-terminal 7 is located and the object to which the third sub-terminal 7 is electrically connected, and the components of the LED module 34 are the same as in the first and fourth embodiments, and therefore, the same descriptions are not repeated.

Figure 16:
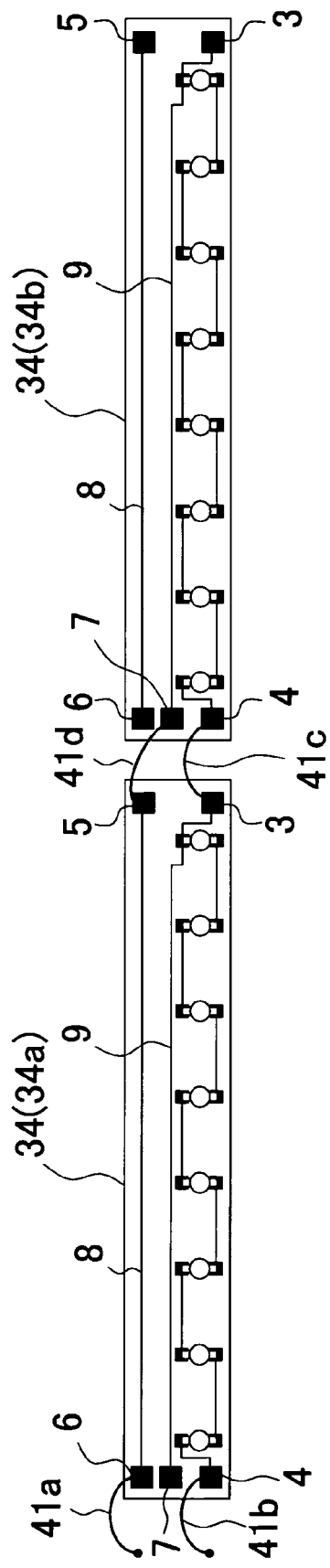
FIG. 16 is a diagram showing an example of connection where two LED modules, as shown in FIG. 15, are connected in series.

Next, in the case where two LED modules 34, as shown in FIG. 15, are connected so that sixteen LEDs in total are connected in series, a method for connecting the external wires 41a to 41d is described in reference to FIG. 16. The method for connecting the external wires 41a to 41d is different from that in the fourth embodiment and similar to the method for connection in the first embodiment shown in FIG. 4. The external wire 41a is connected directly to the second sub-terminal 6 of the LED module 34a, and the external wire 41b is connected directly to the second main terminal 4 of the LED module 34a. The external wire 41c connects the first main terminal 3 of the LED module 34a directly to the second main terminal 4 of the LED module 34b, and the external wire 41d connects the first sub-terminal 5 of the LED module 34a directly to the third sub-terminal 7 of the LED module 34b.

Though in the method for connection in the first embodiment shown in FIG. 4 and in the third embodiment, the first main terminal 3 and the first sub-terminal 5 located on the side of the LED module 30b farthest from the control substrate are connected through the external wire 41e or the short-circuit element 22, the fifth embodiment is different from the method for connection in the first embodiment shown in FIG. 4 and the third embodiment in that the external wire 41d connects the first sub-terminal 5 of the LED module 34a directly to the third sub-terminal 7 of the LED module 34b, and a process for shortcircuit is not carried out between the first main terminal 3 and the first sub-terminal 5 located on the side of the LED module 34b farthest from the control substrate. As a result, the process for shortcircuit using the external wire 41e or the short-circuit element 22 in the first embodiment shown in FIG. 4 and in the third embodiment is unnecessary, and the process for connection for the external wires 41a to 41d can be simplified.

The external wire 41c connects sixteen LEDs 1 in series in the opposite direction of that in the fourth embodiment between the first main terminal 3 of the LED module 34a and the second main terminal 4 of the LED module 34b, and the external wire 41d electrically connects the first main terminal 3 of the LED module 34b to the second sub-terminal 6 of the LED module 34a via the first passing wire 8 of the LED module 34a and the second passing wire 9 of the LED module 34b so that the external wire 41a and the first main terminal 3 of the LED module 34b are electrically connected to each other. As a result of this, sixteen LEDs connected in series can be driven and controlled from the control substrate through the four short external wires 41a to 41d.

Figure 17:
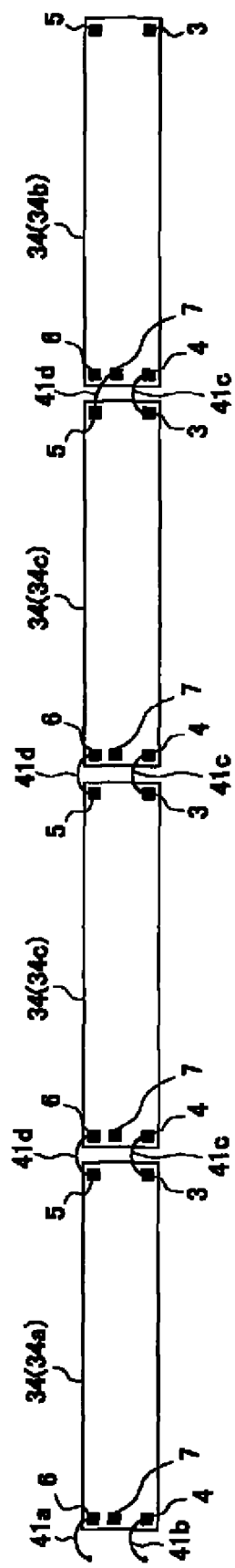
FIG. 17 is a diagram showing an example of connection where four LED modules, as shown in FIG. 15, are connected in series.

The structure in the fifth embodiment is different from that in the first embodiment shown in FIG. 4 only in the manner how the first main terminal 3 located on the side of the LED module 34b (30b) farthest from the control substrate is electrically connected to the second sub-terminal 6 of the LED module 33a (30a) connected to the external wire 41a, and therefore, it can be seen, as in the structure in the first embodiment shown in FIG. 4, that the external wires are made much shorter as compared to the conventional structures shown in FIGS. 29 and 30. Furthermore, in the case where three or more LED modules 34, as shown in FIG. 15, are connected so that the number of LEDs connected in series is 8n (n is an integer of 3 or greater), as shown in FIG. 17, the third and onwards LED modules 34c are inserted between the two LED modules 34a and 34b so that the first main terminal 3 of the LED module 34a and the first main terminal 3 of the LED module 34c are connected directly to the second main terminal 4 of the LED module 34c and the second main terminal 4 of the LED module 34b, respectively, through the external wires 41c, and the first sub-terminal 5 of the LED module 34a and the first sub-terminal 5 of the LED module 34c are connected directly to the second sub-terminal 6 of the LED module 34c and the third sub-terminal 7 of the LED module 34b, respectively, through the external wires 41d in the same manner as in the configuration shown in FIG. 16. Furthermore, in the case where two or more LED modules 34c are added, the first main terminal 3 of the LED module 34c is connected directly to the second main terminal 4 of the adjacent LED module 34c through the external wire 41c, and the first sub-terminal 5 of the LED module 34c is connected directly to the second sub-terminal 6 of the adjacent LED module 34c through the external wire 41d. As shown in FIG.

17, the side on which the first main terminal 3 and the first sub-terminal 5 are placed in one LED module 34 and the side on which the second main terminal 4, the second sub-terminal 6 and the third sub-terminal 7 are located in the next LED module 34 are located in close proximity so that the LED modules 34 aligned in sequence are connected through the external wires 41c and 41d, and thus, the number of LEDs connected in series can be easily increased. Here, LEDs 1 in the LED modules 34, connecting wires 11 to 19, electrodes 20 to 21, first passing wires 8 and second passing wires 9 are not shown in FIG. 17.

Next, in the case where a number of LED modules 34 as in the fifth embodiment are used in such a manner that the eight LEDs 1 connected in series in each LED module 34 are connected in parallel, a method for connecting external wires 41a to 41e is described in reference to FIG. 18. Here, in the example shown in FIG. 18, four LED modules 34 are connected in parallel. This is different from the configuration shown in FIG. 17 in that the LED modules 34 are turned 180 degrees in the arrangement, and furthermore, the external wire 41e is used in the same manner as in the first embodiment. The external wire 41a is connected directly to the first main terminal 3 of the LED module 34a, and the external wire 41b is connected directly to the first sub-terminal 5 of the LED module 34a. The external wires 41c connect the third sub-terminal 7 of the LED module 34a, the third sub-terminal 7 of the LED module 34c and the third sub-terminal 7 of the LED module 34c directly to the first main terminal 3 of the LED module 34c, the first main terminal 3 of the LED module 34c and the first main terminal 3 of the LED module 34b, respectively, and the external wires 41d connect the second sub-terminal 6 of the LED module 34a, the second sub-terminal 6 of the LED module 34c and the second sub-terminal 6 of the LED module 34c directly to the first sub-terminal 5 of the LED module 34c, the first sub-terminal 5 of the LED module 34c and the first sub-terminal 5 of the LED module 34b, respectively. The external wires 41e connect the second main terminals 4 of the four LED modules 34a, 34b and 34c directly to the second sub-terminals 6.

Figure 27:
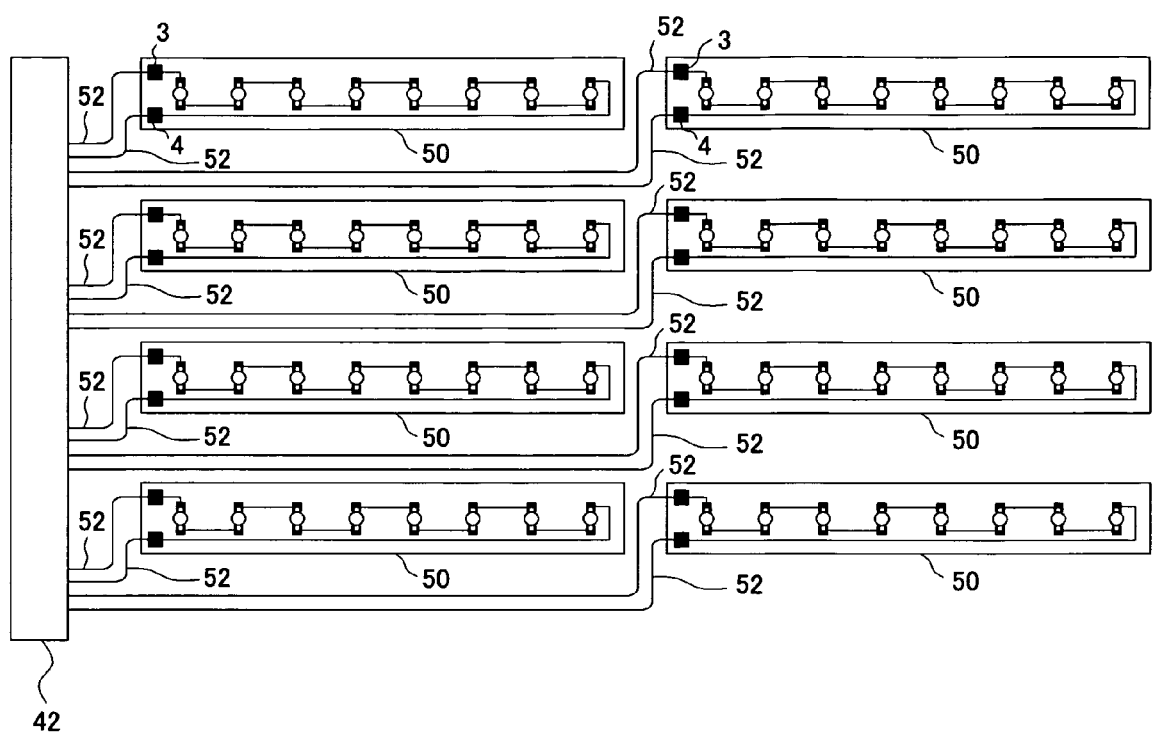
FIG. 27 is a diagram showing an example of connection where eight LED modules, as shown in FIG. 25, are connected in parallel.
Figure 28:
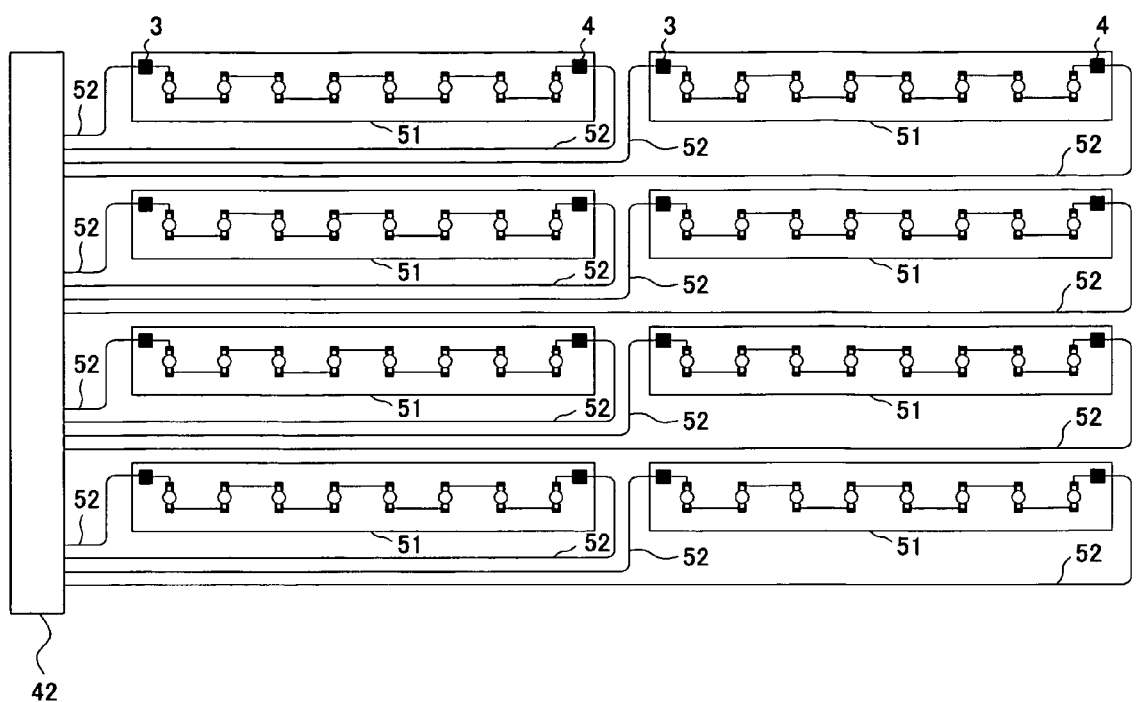
FIG. 28 is a diagram showing an example of connection where eight LED modules, as shown in FIG. 26, are connected in parallel.

It can be seen that the external wires are made much shorter as the configuration shown in FIG. 18 is compared to the conventional configurations shown in FIGS. 27 and 28. Here, the same parallel connection is possible when a number of LED modules 33, as in the fourth embodiment, are used.

Sixth Embodiment

Next, the LED module according to the sixth embodiment of the present invention is described. Though in the above described embodiments cases where nine connecting wires 11 to 19 and a first passing wire 8 are formed in the same plane on the insulating substrate 2 are described, it is also preferable to form connecting wires 11 to 19 on one surface (for example, on the front surface) of the insulating substrate 2 and for the first passing wire 8 to be formed on the other surface (for example, on the rear surface).

FIG. 19 schematically shows the structure of the LED module according to the sixth embodiment of the present invention, which is a modification of the LED module 31 in the second embodiment. FIG. 19A shows the first surface of a printed wiring board 35' before LEDs are mounted, which is the side on which connecting wires 11 to 19 are formed, FIG. 19B shows the second surface of an LED module 35, which is the side on which a first passing wire 8 is formed, FIG. 19C shows the first surface of the LED module 35 (35a) after LEDs 1 have been mounted, and FIG. 19D shows the first surface of the LED module 35 (35b) after LEDs 1 and a short-circuit element 22 have been mounted.

The printed wiring board 35' comprises an insulating substrate 2 where nine connecting wires 11 to 19 for connecting eight LEDs 1 in series, electrodes 20 and 21, a first main terminal 3 and a second main terminal 4 for the connecting to an external circuit, and electrodes 23 and 24 are formed on the first surface, a first sub-terminal 5 and a second sub-terminal 6 for the connection to an external circuit, and a first passing wire 8 for electrically connecting the first sub-terminal 5 to the second sub-terminal 6 are formed on the second surface of the insulating substrate 2, and furthermore, a first through hole 25 penetrating through the insulating substrate 2 between the first and second surfaces with the inner wall surface coated with a metal resulting from metal plating or the like is created so as to electrically connect the electrode 24 to the first passing wire 8. The insulating substrate 2 is formed of an insulating material, such as glass epoxy, while the connecting wires 11 to 19, the four terminals 3 to 6, the first passing wire 8 and the electrodes 20, 21, 23 and 24 are formed of a metal film, such as a copper foil.

The printed wiring board 35' in the sixth embodiment is different from the printed wiring board 31' in the second embodiment in that the first sub-terminal 5, the second sub-terminal 6 and the first passing wire 8 are formed on the second surface that is the opposite side of the first surface on which the first main terminal 3, the second main terminal 4 and the connecting wires 11 to 19 are formed, and a new first through hole 25 is added, and the components other than the first through hole 25 are the same as in the first embodiment, and therefore, the same descriptions are not repeated.

In the sixth embodiment, the first passing wire 8 and the connecting wires 11 to 19 are formed separately between the first and second surfaces of the insulating substrate 2, and therefore, the area occupied by the first passing wire 8 and the width of the first passing wire 8 can be made greater than in the second embodiment, and thus, the LED module 35 can have better heat releasing performance and the impedance of the first passing wire 8 can be low. As for the heat releasing properties, LEDs 1 are mounted on the first surface of the insulating substrate 2, and therefore, the heat of the insulating substrate 2 that has been heated on the first surface side can be released from the second surface via the first passing wire 8 having a heat conductance higher than that of the insulating substrate 2.

The LED module 35 in the sixth embodiment is electrically equivalent to the LED module 31 in the second embodiment, and therefore, the method for connecting the external wires 41a to 41d is basically the same as in the second embodiment in the case where LED modules 35 are connected so that the number of LEDs 1 mounted in the LED modules 35 and connected in series is increased by the same number of times as the number by which the number of modules increases. However, it is necessary for the external wires 41a and 41c to be connected on the first surface of the insulating substrate 2 and for the external wires 41b and 41d to be connected on the second surface of the insulating substrate 2. FIG. 20 shows a method for connecting the external wires 41a to 41d in the case where one LED module 35a and one LED module 35b are connected so that sixteen LEDs in total are connected in series. Here, the method for electrically connecting the external wires 41a to 41d is the same as in the second embodiment as described above, and therefore, the same descriptions are not repeated.

Figure 21A:
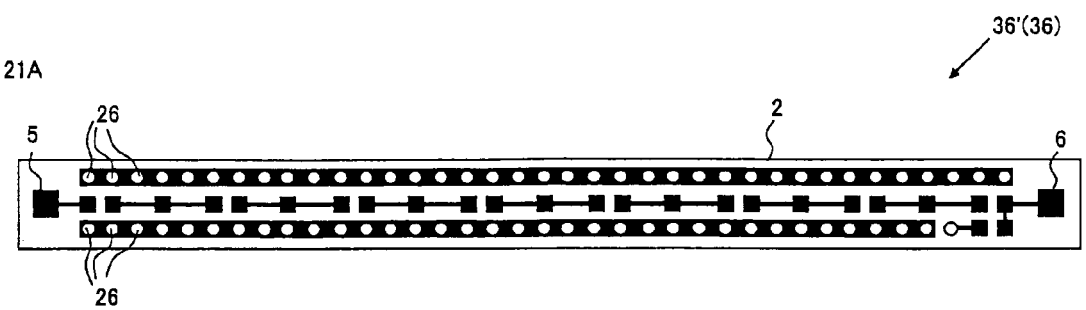
FIG. 21 is a schematic plan diagram showing the structure of an LED module of which the heat releasing properties have been improved in comparison with the LED module shown in FIG. 19.
Figure 21B:
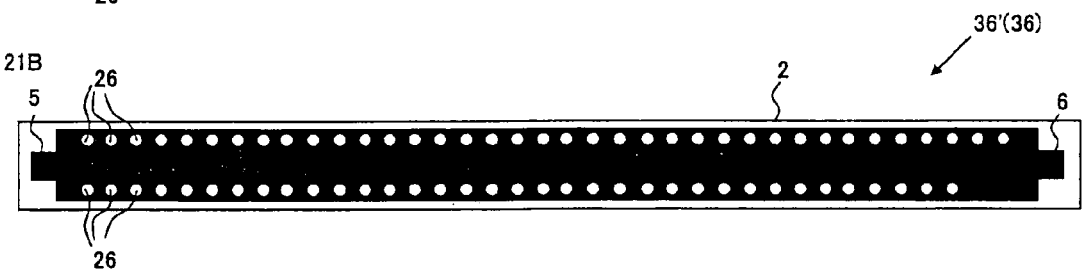

It is also preferable to provide an LED module 36 by forming, as shown in FIG. 21, a first passing wire 8 on the two sides, first surface and second surface, of the insulating substrate 2 of an LED module 35, as shown in FIG. 19, in order to further improve heat releasing properties, where the first passing wires 8 on the two sides are electrically connected through a great number of second through holes 26. The second through holes 26 are created in the same manner as the first through hole 25. FIG. 21A shows the first surface of the LED module 36 (printed wiring board 36') before LEDs are mounted, and FIG. 21B shows the second surface of the LED module 36. The LED module 36 shown in FIG. 21 is provided with a great number of second through holes 26 so that the heat emitted from the LEDs 1 mounted on the first surface of the insulating substrate 2 is conveyed from the first surface side to the first passing wire 8 on the second surface side via the second through holes 26, thus making it possible to efficiently reduce heat from the first passing wire 8, and therefore, the heat releasing properties are further improved than in the LED module 35 shown in FIG. 19.

Figure 22:
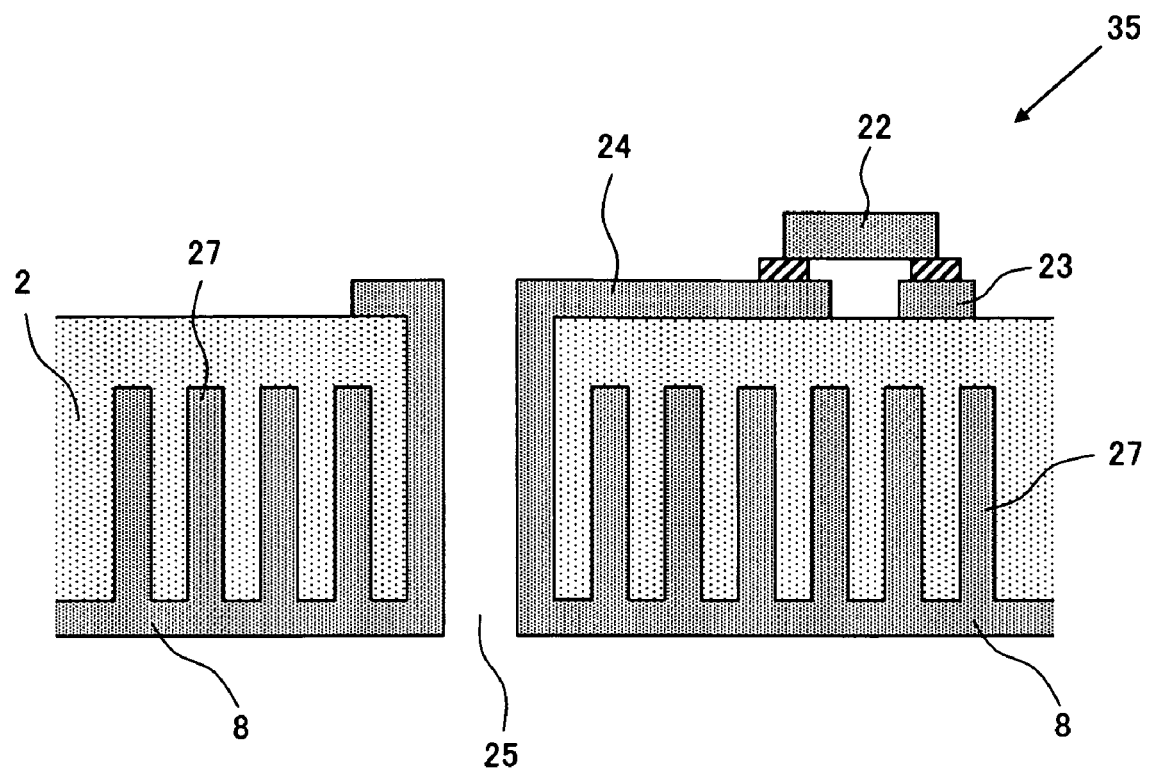
FIG. 22 is a cross sectional diagram showing the structure of a main portion of an LED module of which the heat releasing properties have been improved in comparison with the LED modules shown in FIGS. 19 and 21.

Furthermore, in order for the LED modules 35 and 36 shown in FIGS. 19 and 21 to have further improved heat releasing properties, it is preferable to form protrusions 27 which protrude towards the inside of the insulating substrate 2 (that is to say, towards the first surface side) on the first passing wire 8 that is formed on the second surface side of the insulating substrate 2 in such a manner as to be distributed throughout the entire surface of the first passing wire 8, as schematically shown in the cross sectional diagram in FIG. 22. The form of the protrusions 27 in a cross section is a comb form, while the form in a plane can be any form, for example, in stripes, grids, lines or crosses, aligned in a matrix. When protrusions 27 are provided, the area of contact between the insulting substrate 2 and the first passing wires 8 is large and the heat releasing properties further improve.

Though in the LED modules 35 and 36 shown in FIGS. 19 and 21 the first sub-terminal 5 and the second sub-terminal 6 in addition to the first passing wire 8 are formed on the second surface of the insulating substrate 2, the first sub-terminal 5 and the second sub-terminal 6 may be formed on the first surface side of the insulating substrate 2 in the same manner as in the first to fifth embodiments so that the first sub-terminal 5 and the second sub-terminal 6 on the first surface side are electrically connected to the first passing wire 8 on the second surface side via through holes.

Here, the second through holes 26 can independently have the same heat releasing effects as those of the great number of second through holes 26 shown in FIG. 21, and therefore, it is preferable to create a great number of second through holes 26 for an electrical connection to the first passing wire 8 on the second surface side. Here, it is necessary for the second through holes 26 to be created in such locations as not to make contact with the connecting wires 11 to 19 on the first surface side, the first main terminal 3 and the second main terminal 4, and electrode 23 and electrode 24. Furthermore, it is preferable to provide a great number of second through holes 26 in the vacant regions on the surface of the insulating substrate 2 in the first to fifth embodiments as well.

Seventh Embodiment

Figure 23:
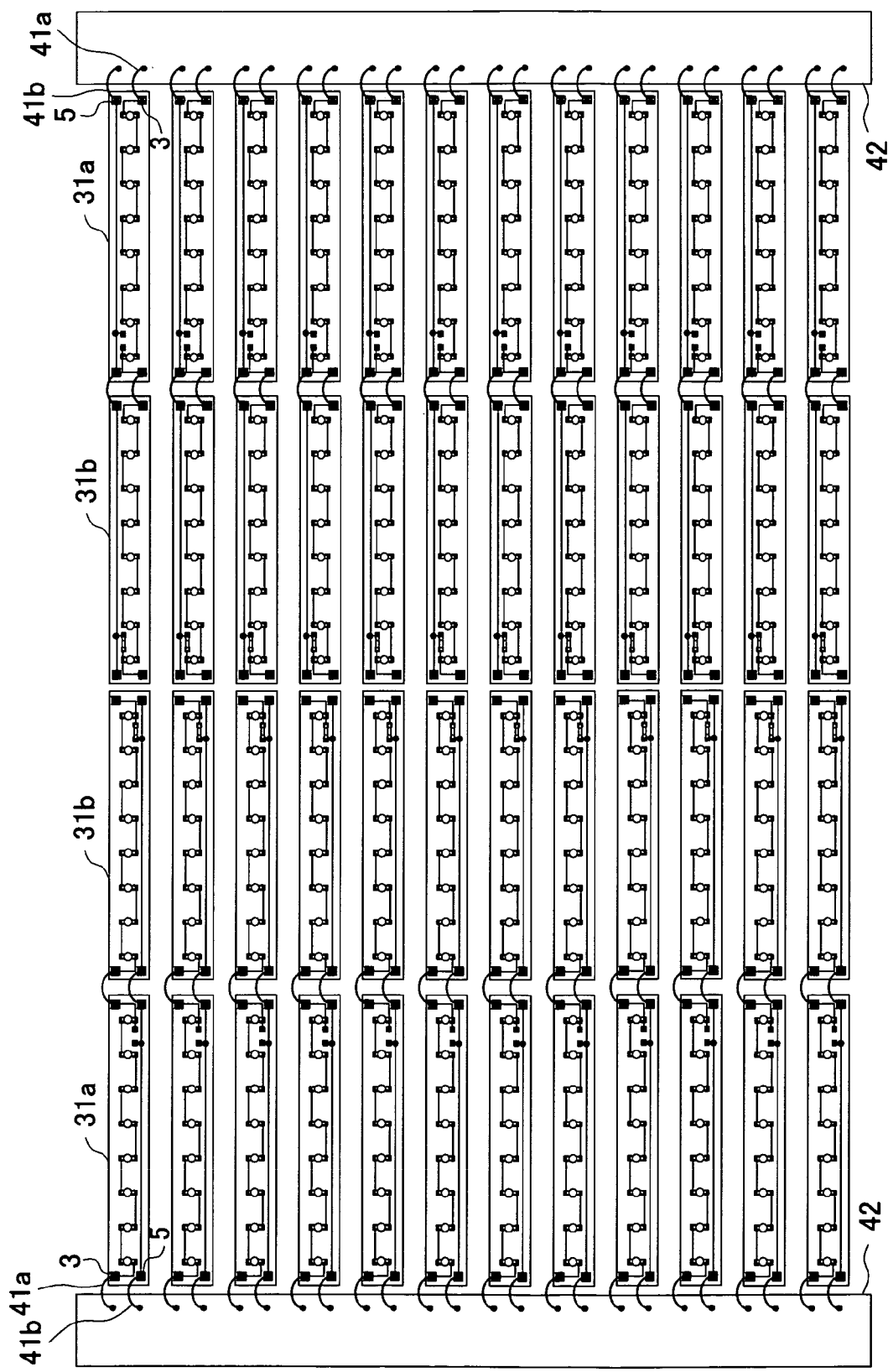
FIG. 23 is a schematic block diagram showing the structure of the LED light source apparatus according to the present invention.

Next, an LED light source apparatus where LED modules 30 to 36, as in the above described embodiments, are aligned in a matrix so that LEDs are arranged so as to be distributed on a surface according to the seventh embodiment of the present invention is described in reference to FIG. 23. Though FIG. 23 illustrates a case where LED modules 31 (31a, 31b), as in the second embodiment, are used, the LED modules used are not limited to those as in the second embodiment.

In the example shown in FIG. 23, the LED light source apparatus is provided with two planes, left and right, and each plane has twelve LED module sets aligned in the direction perpendicular to the longitudinal direction of the LED modules 31 where each LED module set has one LED module 31a and one LED module 31b, which have the structures shown in FIG. 6 and are connected to each other, so that sixteen LEDs in total are connected in series. Here, the arrangements of LED module sets of the LED modules 31a and 31b are turned 180 degrees in the two planes, left and right.

In the configuration shown in FIG. 23, the number of LED modules 31 aligned in the longitudinal direction of the LED module 31 is four, and they are divided into the two planes, left and right, each of which is provided with a control substrate 42 for driving the LEDs so as to control light emission, and therefore, the number of LEDs connected in series and driven by a control substrate 42 is sixteen, and thus, the voltage for driving a column of LEDs connected in series can be prevented from increasing.

FIG. 24 schematically shows the structure of the drive circuit on a control substrate 42 for driving a column of LEDs connected in series in each LED module set so as to control light emission. As shown in FIG. 24, an LED column 37 and a current control element 38 are connected in series between the first power supply VH on the high voltage side and the second power supply VL on the low voltage side in order to supply a high voltage for energizing the LED column 37 between the anode terminal 37A and the cathode terminal 37C of the LED column 37. There are two cases where the current control element 38 is provided on the first power supply VH side and the current control element 38 is provided on the second power supply VL side. The amount of current that flows through the current control element 38 is adjusted so that the voltage applied to the individual LEDs in the LED column 37 does not exceed the rated value. The brightness of the light emitted from the LEDs changes depending on the current that flows through the LED column 37, and the period during which a current flows can be adjusted through a PWM (pulse width modulation) control over the current that flows through the LED column 37, and thus, the brightness of the emitted light can be adjusted. In this case, a switching element (not shown) for PWM control is provided for each LED column 37 or for the entirety of the control substrate 42 so that PWM control is carried out on each LED column 37 unit or on the entirety of the control substrate 42.

Next, the apparatuses according to other embodiments of the present invention are described.

(1) Though the above described embodiments are described by citing an example of cases where eight LEDs are connected in series in each LED module, the number of LEDs connected in series in each LED module is not limited to eight. Furthermore, the arrangement and the form of the connecting wires 11 to 19 on the insulating substrate 2 are not limited to those illustrated in the above described embodiments.

(2) Though in the above described embodiments the first main terminal 3 is provided on the anode side of each LED column so as to be used as an anode terminal for the LED module and the second main terminal 4 is provided on the cathode side of each LED column so as to be used as a cathode terminal for the LED module, the first main terminal 3 may be used as a cathode terminal and the second main terminal 4 may be used as an anode terminal.

(3) Though the above described embodiments illustrate cases where the first main terminal 3, the second main terminal 4, the first sub-terminal 5, the second sub-terminal 6 and the third sub-terminal 7 are formed of a metal film, such as a copper foil, on the surface of the insulting substrate 2, a first two-pinned connector part is mounted in an edge portion on one side of the two facing sides of the insulating substrate 2 so that the pins are allocated to the first main terminal 3 and the first sub-terminal 5, while a second two-pinned connector part is mounted in an edge portion on the other side of the two facing sides of the insulating substrate 2 so that the pins are allocated to the second main terminal 4 and the second sub-terminal 6 where one of the first and second two-pinned connector parts is formed as a male pin and the other is formed as a female pin in the first to third embodiments, for example. In this case, the external wires 41*a* to 41*d* are connected by engaging two two-pinned connector parts, and the external wires 41*a* to 41*d* are not necessary. Here, if the two-pinned connector parts are regarded as external wires, the external wires are mounted on the LED module in advance.

(4) Though the above described embodiments illustrate cases where each LED module is provided with a set of connecting wires 11 to 19, the first main terminal 3 and the second main terminal 4, two or more sets of connecting wires 11 to 19, the first main terminal 3 and the second main terminal 4 may be provided so that the two or more sets share the first sub-terminal 5, the second sub-terminal 6 and the first passing wire 8 in the configuration.

(5) Though in the above described embodiments only one type of LED module is used, different types of LED modules in the above described embodiments may be combined when an LED light source apparatus is formed by aligning a number of LED modules.

The LED module according to the present invention is applicable as an LED module where a number of LEDs are mounted and connected in series and in an LED light source apparatus provided with such LED modules.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. An LED module comprising:
an insulating substrate in plate form;
a first main terminal and a first sub-terminal for connection to an external circuit formed in a vicinity of a first side of the insulating substrate;
a second main terminal and a second sub-terminal for connection to an external circuit formed in a vicinity of a second side of the insulating substrate, the second side being opposite to the first side of the insulating substrate;
three or more connecting wires formed on the insulating substrate for connecting LEDs in series, the LEDs being aligned side by side;
a plurality of LEDs individually connected between the connecting wires that are adjacent to each other and connected in series in a same direction;
a first passing wire formed on the insulating substrate for electrically connecting the first sub-terminal to the second sub-terminal, wherein
a first connecting wire, which is one of the three or more connecting wires aligned side by side and is located on one side, is electrically connected to the first main terminal, and
a second connecting wire, which is another of the three or more connecting wires aligned side by side and is located on other side, is electrically connected to the second main terminal; and
a pair of electrodes for connection to terminals of a two-terminal element for short circuit formed on the insulating substrate, wherein
one of the pair of electrodes for connection is electrically connected to the first connecting wire or the second connecting wire, and the other of the pair of electrodes for connection is electrically connected to the first passing wire.

2. The LED module according to claim 1, wherein
the three or more connecting wires are formed on a surface on one side of the insulating substrate, and
the first passing wire is formed on a surface of other side of the insulating substrate.

3. The LED module according to claim 2, wherein
the first passing wire is formed on both surfaces of the insulating substrate, and
the first passing wire formed on the surface on one side of the insulating substrate and the first passing wire formed on the surface on the other side of the insulating substrate are electrically connected via a plurality of through holes of which inner wall surfaces are coated with a metal and which are created in the insulating substrate.

4. The LED module according to claim 2, wherein
the first passing wire formed on the surface on the other side of the insulating substrate is provided with a protrusion that protrudes into the insulating substrate.

5. The LED module according to claim 1, wherein
the first main terminal, the second main terminal and the three or more connecting wires are formed on a surface on one side of the insulating substrate, and
the first sub-terminal, the second sub-terminal and the first passing wire are formed on a surface of other side of the insulating substrate.

6. The LED module according to claim 5, wherein
the first passing wire is formed on surfaces of both sides of the insulating substrate, and
the first passing wire formed on the surface on one side of the insulating substrate and the first passing wire formed on the surface on the other side of the insulating substrate are electrically connected via a plurality of through holes of which inner wall surfaces are coated with a metal and which are created in the insulating substrate.

7. The LED module according to claim 5, wherein
the first passing wire formed on the surface on the other side of the insulating substrate is provided with a protrusion that protrudes into the insulating substrate.

8. The LED module according to claim 1, wherein
a plurality of through holes of which inner wall surfaces are coated with a metal are created in the insulating substrate.

9. An LED light source apparatus, wherein
LED module columns are formed such that:
a plurality of LED modules each according to claim 1 are aligned in a first direction so that a first side of an LED module is in a proximity of a second side of a next LED module;
a first main terminal provided in a vicinity of the first side of the LED module and a second main terminal provided in a vicinity of the second side of the next LED module are electrically connected; and
a first sub-terminal provided in the vicinity of the first side of the LED module and a second sub-terminal provided in the vicinity of the second side of the next LED module are electrically connected, and a plurality of the LED module columns are aligned in a second direction, which is perpendicular to the first direction, so that the plurality of LEDs mounted in the LED modules are aligned in a plane.

10. An LED module comprising:
an insulating substrate in plate form;
a first main terminal and a first sub-terminal for connection to an external circuit formed in a vicinity of a first side of the insulating substrate;
a second main terminal and a second sub-terminal for connection to an external circuit formed in a vicinity of a second side of the insulating substrate, the second side being opposite to the first side of the insulating substrate;
a third sub-terminal for connection to an external circuit formed in the vicinity of the first side of the insulating substrate;
three or more connecting wires formed on the insulating substrate for connecting LEDs in series, the LEDs being aligned side by side;
a plurality of LEDs individually connected between the connecting wires that are adjacent to each other and connected in series in a same direction;
a first passing wire formed on the insulating substrate for electrically connecting the first sub-terminal to the second sub-terminal, wherein
a first connecting wire, which is one of the three or more connecting wires aligned side by side and is located on one side, is electrically connected to the first main terminal, and
a second connecting wire, which is another of the three or more connecting wires aligned side by side and is located on other side, is electrically connected to the second main terminal; and
a second passing wire for electrically connecting the second main terminal or the second connecting wire to the third sub-terminal formed on the insulating substrate.

* * * * *